(12) United States Patent
Seong et al.

(10) Patent No.: US 9,780,144 B2
(45) Date of Patent: Oct. 3, 2017

(54) MEMORY DEVICE AND METHOD OF MANUFACTURING THE SAME

(71) Applicant: SAMSUNG ELECTRONICS CO., LTD., Suwon-si, Gyeonggi-Do (KR)

(72) Inventors: Dong-Jun Seong, Seongnam-si (KR); Soon-Oh Park, Suwon-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/342,497

(22) Filed: Nov. 3, 2016

(65) Prior Publication Data
US 2017/0243919 A1     Aug. 24, 2017

(30) Foreign Application Priority Data

Feb. 22, 2016 (KR) .................. 10-2016-0020681

(51) Int. Cl.
*H01L 27/24* (2006.01)

(52) U.S. Cl.
CPC ........ *H01L 27/2427* (2013.01); *H01L 27/249* (2013.01)

(58) Field of Classification Search
CPC .................... H01L 27/2427; H01L 27/249
See application file for complete search history.

(56) References Cited

U.S. PATENT DOCUMENTS

| 7,129,534 | B2 | 10/2006 | Tuttle |
| 7,439,536 | B2 * | 10/2008 | Pellizzer ............ G11C 13/0004 257/2 |
| 8,345,463 | B2 | 1/2013 | Lee et al. |
| 8,486,752 | B2 | 7/2013 | Chang |
| 8,623,697 | B2 | 1/2014 | Magistretti et al. |
| 8,634,236 | B2 | 1/2014 | Park et al. |
| 9,029,826 | B2 | 5/2015 | Chang et al. |
| 9,190,613 | B2 | 11/2015 | Jung et al. |
| 2011/0186798 | A1 | 8/2011 | Kwon et al. |
| 2014/0291604 | A1 | 10/2014 | Pellizzer et al. |
| 2014/0374683 | A1 | 12/2014 | Kim et al. |
| 2015/0028280 | A1 | 1/2015 | Sciarrillo et al. |
| 2015/0090954 | A1 | 4/2015 | Li |
| 2015/0243884 | A1 | 8/2015 | Brightsky et al. |
| 2015/0243885 | A1 | 8/2015 | Sciarrillo |

FOREIGN PATENT DOCUMENTS

| KR | 100728982 | 6/2007 |
| KR | 101298258 | 8/2013 |

* cited by examiner

*Primary Examiner* — David Vu
(74) *Attorney, Agent, or Firm* — F. Chau & Associates, LLC

(57) ABSTRACT

A method of manufacturing a memory device includes sequentially forming and then etching a preliminary selection device layer, a preliminary middle electrode layer, and a preliminary variable resistance layer on a substrate, thereby forming a selection device, a middle electrode, and a variable resistance layer. At least one of a side portion of the selection device or a side portion of the variable resistance layer is removed so that a first width of the middle electrode in a first direction parallel to a top of the substrate is greater than a second width of the variable resistance layer in the first direction or a third width of the selection device in the first direction. A capping layer is formed on at least one of a side wall of the etched side portion of the selection device or a side wall of the etched side portion of the variable resistance layer.

13 Claims, 40 Drawing Sheets

X1 – X1'

X1 – X1'

MEMORY DEVICE AND METHOD OF MANUFACTURING THE SAME

CROSS-REFERENCE TO RELATED APPLICATION

This application claims priority under 35 U.S.C. §119 to Korean Patent Application No. 10-2016-0020681, filed on Feb. 22, 2016, in the Korean Intellectual Property Office, the disclosure of which is incorporated by reference herein in its entirety by reference.

TECHNICAL FIELD

Exemplary embodiments of the present inventive concept relate to a memory device, and more particularly to a method of manufacturing the same.

DISCUSSION OF RELATED ART

With the lightening, thinning, and miniaturizing trend of electronic products, the demand for high-integration of semiconductor devices has increased. Memory devices having a three-dimensional (3D) cross-point structure in which a memory cell is disposed at a cross point between two electrodes have been proposed. When down-scaling of memory devices having a cross-point structure, widths and/or thicknesses of substantially all layers in each memory device may also be reduced. Thus, the electrical characteristic and reliability of the down-scaled memory devices may be reduced.

SUMMARY

Exemplary embodiments of the present inventive concept provide a memory device having a cross-point array type, which may have excellent electrical characteristics and increased reliability, and a method of manufacturing the same.

According to an exemplary embodiment of the present inventive concept, a method of manufacturing a memory device includes sequentially forming a preliminary selection device layer, a preliminary middle electrode layer, and a preliminary variable resistance layer on a substrate. The preliminary selection device layer, the preliminary middle electrode layer, and the preliminary variable resistance layer are etched, thereby forming a selection device, a middle electrode, and a variable resistance layer sequentially stacked on the substrate. At least one of a side portion of the selection device or a side portion of the variable resistance layer is removed so that a first width of the middle electrode in a first direction parallel to a top of the substrate is greater than a second width of the variable resistance layer in the first direction or a third width of the selection device in the first direction. A capping layer is formed on at least one of a side wall of the etched side portion of the selection device or a side wall of the etched side portion of the variable resistance layer.

According to an exemplary embodiment of the present inventive concept, a method of manufacturing a memory device includes sequentially forming a preliminary selection device layer, a preliminary middle electrode layer, and a preliminary variable resistance layer on a substrate. The preliminary selection device layer, the preliminary middle electrode layer, and the preliminary variable resistance layer are etched, thereby forming a selection device, a middle electrode, and a variable resistance layer which are sequentially stacked on the substrate. At least one of a side portion of the selection device or a side portion of the variable resistance layer is removed so that a first width of the middle electrode in a first direction parallel to a top of the substrate is greater than a second width of the variable resistance layer in the first direction or a third width of the selection device in the first direction. A capping layer is formed on at least one of a side wall of the etched side portion of the selection device and a side wall of the etched side portion of the variable resistance layer. An insulation pattern is formed on a side wall of the capping layer and a side wall of the middle electrode by using a material having a dielectric constant less than a dielectric constant of the capping layer.

According to an exemplary embodiment of the present inventive concept, a memory device includes a plurality of first word lines extending in a first direction parallel to a top of a substrate. A plurality of bit lines extends in a second direction on the substrate, the second direction being different from the first direction. A plurality of memory units are respectively arranged at cross points between the plurality of bit lines and the plurality of first word lines, each of the plurality of memory units including a selection device, a middle electrode, and a variable resistance layer. A first capping layer is disposed on a side wall of a recessed portion of each of the variable resistance layers and a second capping layer is disposed on a side wall of a recessed portion of each of the selection devices. The second capping layer is spaced apart from the first capping layer.

BRIEF DESCRIPTION OF THE DRAWINGS

The above and other features of the inventive concept will become more apparent by describing in detail exemplary embodiments thereof, with reference to the accompanying drawing, in which.

DETAILED DESCRIPTION OF THE EMBODIMENTS

Figure 1:
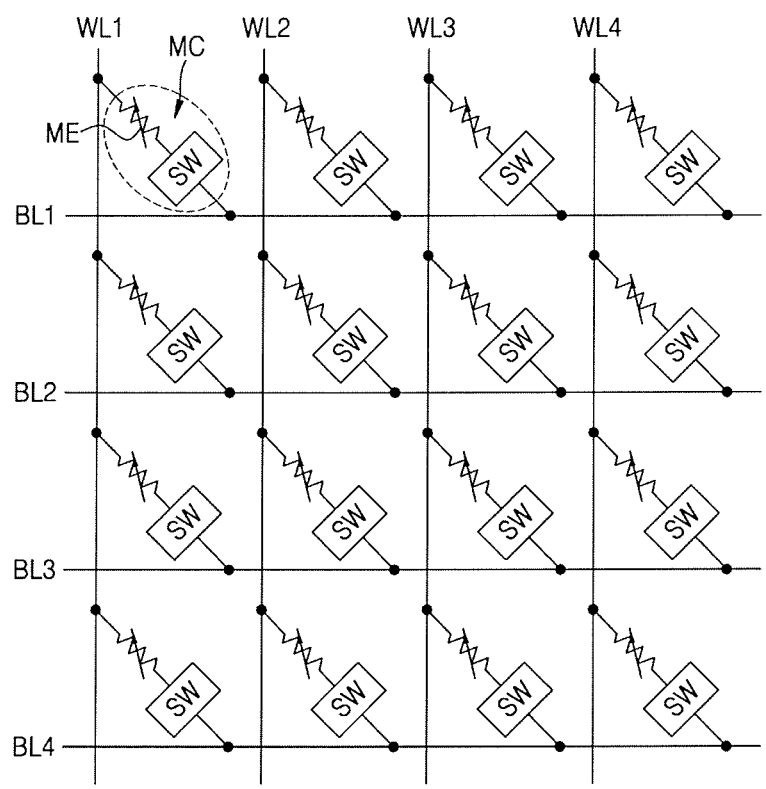
FIG. 1 is an equivalent circuit diagram of a memory device according to an exemplary embodiment of the present inventive concept.

FIG. 1 is an equivalent circuit diagram of a memory device according to an exemplary embodiment of the present inventive concept.

Referring to FIG. 1, a memory device 100 may include a plurality of word lines WL1 to WL4 that extend along a first direction and are spaced apart from each other in a second direction perpendicular to the first direction. The memory device 100 may include a plurality of bit lines BL1 to BL4 that extend along the second direction and are spaced apart from each other in the first direction. The memory device 100 may include a memory unit MC positioned at each cross point between the word lines WL1 to WL4 and the bit lines BL1 to BL4.

The memory unit MC may include a variable resistance layer ME for storing information and a selection device SW for selecting the memory unit MC. In the memory unit MC positioned between the word line WL1 and the bit line BL1, the variable resistance layer ME may be electrically connected to the word line WL1, the selection device SW may be electrically connected to the bit line BL1, and the variable resistance layer ME and the selection device SW may be serially connected to each other. However, exemplary embodiments of the present inventive concept are not limited thereto. For example, in an exemplary embodiment of the present inventive concept, in the memory unit MC, the selection device SW may be directly connected to the word line WL1, and the variable resistance layer ME may be directly connected to the bit line BL1.

A voltage may be applied to the variable resistance layer ME of the memory unit MC through the word lines WL1 to WL4 and the bit lines BL1 to BL4, and thus, a current may flow in the variable resistance layer ME. The variable resistance layer ME may include a phase change material layer which reversibly shifts between a first state and a second state. However, the variable resistance layer ME is not limited thereto. For example, in an exemplary embodiment of the present inventive concept, the variable resistance layer ME may include an arbitrary variable resistor whose resistance value varies according to a voltage applied thereto. For example, a resistance of the variable resistance layer ME may be reversibly shifted between the first state and the second state according to a voltage applied to the variable resistance layer ME of a selected memory unit MC.

The memory unit MC may store digital information such as "0" or "1" in accordance with a resistance change of the variable resistance layer ME, and the digital information may be erased from the memory unit MC. For example, data may be written as a high resistance state "0" and a low resistance state "1" in the memory unit MC. Writing from the high resistance state "0" to the low resistance state "1" may be referred to as a set operation, and writing from the low resistance state "1" to the high resistance state "0" may be referred to as a reset operation. However, the memory unit MC according to exemplary embodiments of the present inventive concept is not limited to only digital information corresponding to the high resistance state "0" and the low resistance state "1" and may store various resistance states.

An arbitrary memory unit MC may be addressed by selecting the word lines WL1 to WL4 and the bit lines BL1 to BL4 and may be programmed by applying a certain signal between the word lines WL1 to WL4 and the bit lines BL1 to BL4, and information based on a resistance value of a variable resistor configuring the arbitrary memory unit MC may be read out by measuring a current value through the bit lines BL1 to BL4.

In the memory device 100 according to an exemplary embodiment of the present inventive concept, a plurality of capping layers 142 and 144 (see, e.g., FIG. 2) may be respectively formed on a side wall of the variable resistance layer ME and a side wall of the selection device SW. For example, referring to FIG. 2, a plurality of capping layer 142 may be formed on sidewalls of a variable resistance layer 132, and a plurality of capping layers 144 may be formed on sidewalls of a selection device 134. A plurality of insulation patterns 150 and 160 (see, e.g., FIG. 2) including a material having a dielectric constant lower than those of the capping layers 142 and 144 may be formed in a space between adjacent memory units MC. For example, referring to FIG. 2, the plurality of insulation patterns 150 and 160 may be formed between each of a plurality of memory cell pillars 130. Thus, RC delay caused by a reduction in dimension of the memory device 100 may be reduced or eliminated, and thus, the memory device 100 may operate at a relatively high speed.

Figure 2:
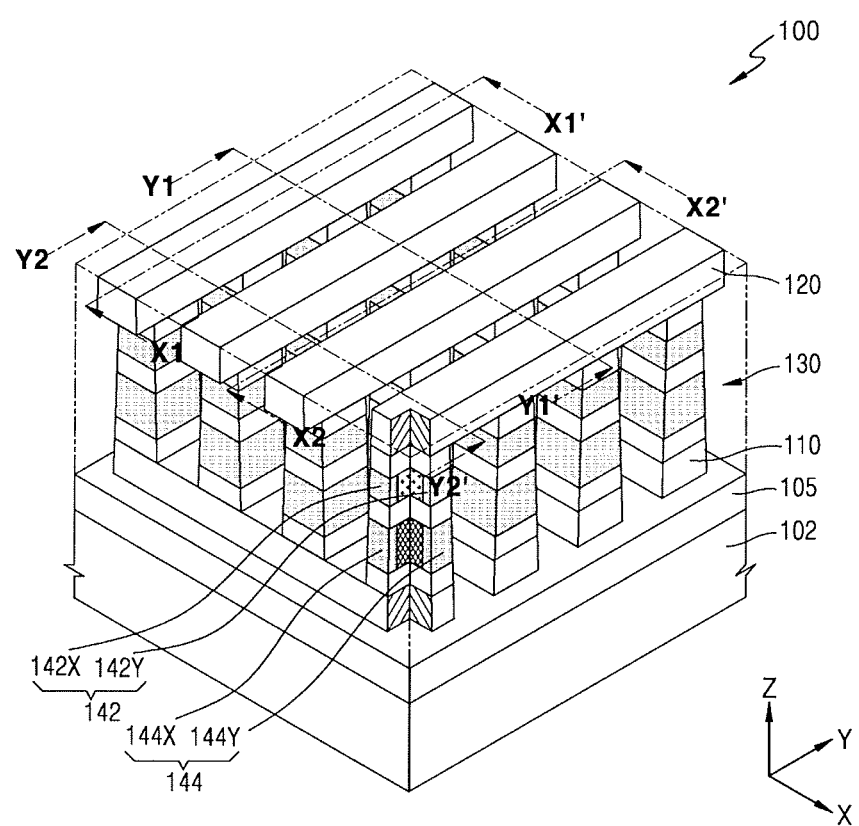
FIG. 2 is a perspective view illustrating a memory device according to an exemplary embodiment of the present inventive concept.
Figure 3:
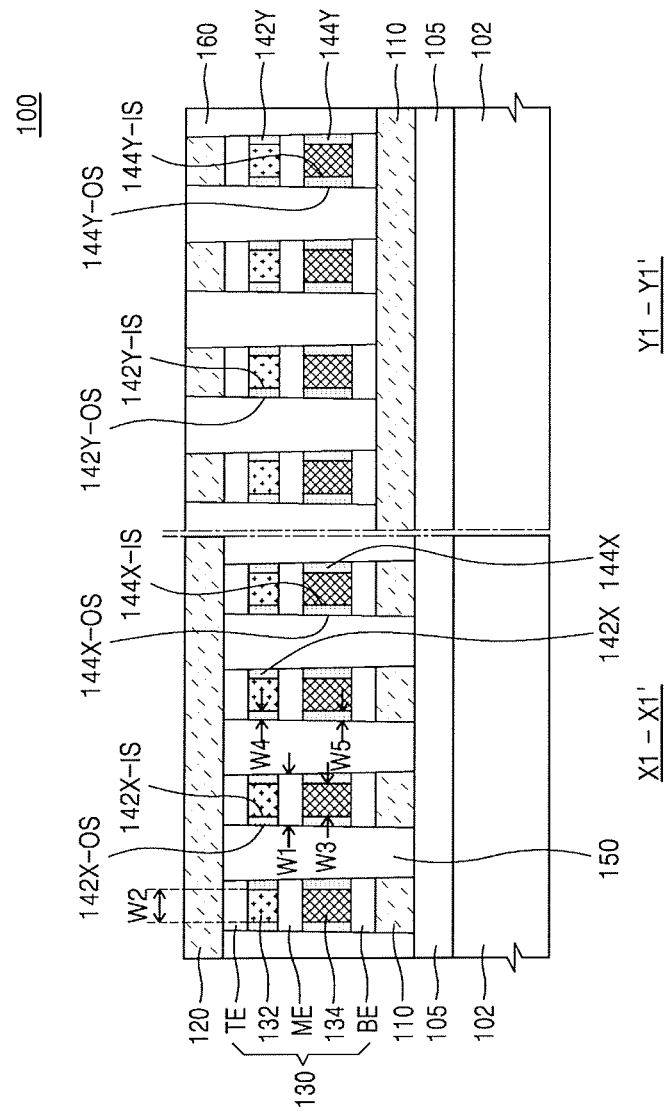
FIG. 3 is a cross-sectional view taken along line X1-X1' and line Y1-Y1' of FIG. 2.
Figure 4:
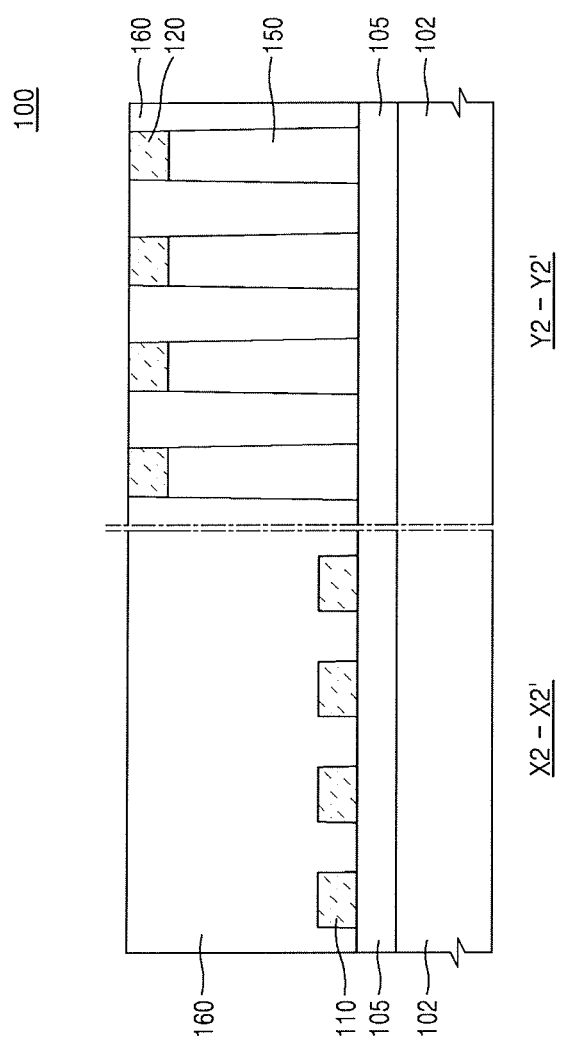
FIG. 4 is a cross-sectional view taken along line X2-X2' and line Y2-Y2' of FIG. 2.

FIG. 2 is a perspective view illustrating the memory device according to an exemplary embodiment of the present inventive concept. FIG. 3 is a cross-sectional view taken along line X1-X1' and line Y1-Y1' of FIG. 2. FIG. 4 is a cross-sectional view taken along line X2-X2' and line Y2-Y2' of FIG. 2.

Referring to FIGS. 2 to 4, the memory device 100 may include a plurality of word lines 110, which extend in a first direction (e.g., an X direction) on a substrate 102, and a plurality of bit lines 120 which extend in a second direction (e.g., a Y direction) perpendicular to the first direction.

An insulating interlayer 105 may be disposed on the substrate 102. The insulating interlayer 105 may include an oxide, such as silicon oxide, or a nitride such as silicon nitride. The insulating interlayer 105 may electrically separate the plurality of word lines 110 from the substrate 102.

The plurality of word lines 110 and the plurality of bit lines 120 may each include metal, conductive metal nitride, conductive metal oxide, or a combination thereof. In an exemplary embodiment of the present inventive concept, the plurality of word lines 110 and the plurality of bit lines 120 may each include tungsten (W), tungsten nitride (WN), gold (Au), silver (Ag), copper (Cu), aluminium (Al), titanium aluminium nitride (TiAlN), iridium (Ir), platinum (Pt), palladium (Pd), ruthenium (Ru), zirconium (Zr), rhodium (Rh), nickel (Ni), cobalt (Co), chromium (Cr), tin (Sn), zinc (Zn), indium tin oxide (ITO), an alloy thereof, or a combination thereof. In an exemplary embodiment of the present inventive concept, the plurality of word lines 110 and the plurality of bit lines 120 may each include a metal layer and a conductive barrier layer covering at least a portion of the metal layer. The conductive barrier layer may include, for example, titanium (Ti), TiN, tantalum (Ta), TaN, or a combination thereof.

Referring to FIGS. 2 to 4, according to an exemplary embodiment of the present inventive concept, the plurality of word lines 110 may be disposed on the substrate 102 and the plurality of bit lines 120 may be disposed on the plurality of word lines 110, but exemplary embodiments of the present inventive concept are not limited thereto. According to an exemplary embodiment of the present inventive concept, the plurality of bit lines 120 may extend in the first direction or the second direction on the substrate 102, and the plurality of word lines 110 may extend in the second direction or the first direction on the plurality of bit lines 120.

Referring to FIG. 2, each of the word lines 110 extending in the first direction (e.g., the X direction) may cross each of the bit lines 120 extending in the second direction (e.g., the Y direction). A plurality of memory units MC may be respectively disposed at a plurality of cross points between the plurality of word lines 110 and the plurality of bit lines 120.

Each of the plurality of memory units MC may include a memory cell pillar 130. Each of the memory cell pillars may include a top electrode TE, the variable resistance layer 132, a middle electrode ME, the selection device 134, and a bottom electrode BE.

In an exemplary embodiment of the present inventive concept, the variable resistance layer 132 may include a phase change material which reversibly changes between a crystalline state and an amorphous state according to a heating duration. For example, the variable resistance layer 132 may include a material of which phase reversibly changes due to Joule heat generated by a voltage applied between both ends of the variable resistance layer 132. A resistance of the material may change with the phase change. The phase change material may be in a high resistance state in an amorphous phase and may be in a low resistance state in a crystalline phase. The high resistance state may be defined as 0, and the low resistance state may be defined as 1, and thus data may be stored in the variable resistance layer 132.

In an exemplary embodiment of the present inventive concept, the variable resistance layer 132 may include one or more elements (e.g., a chalcogen element) from periodic table Group VI and may additionally include one or more chemical modifiers from Group III, IV or V. For example, the variable resistance layer 132 may include Ge—Sb—Te. A chemical composition mark including hyphens (-) may represent a certain compound or an element included in a compound and may represent all chemical formula structures including a represented element. For example, Ge—Sb—Te may be a material such as $Ge_2Sb_2Te_5$, $Ge_2Sb_2Te_7$, $Ge_1Sb_2Te_4$, $GeSb_4Te_7$, or the like.

The variable resistance layer 132 may include various phase change materials in addition to Ge—Sb—Te. For example, the variable resistance layer 132 may include at least one of Ge—Te, Sb—Te, In—Se, Ga—Sb, In—Sb, As—Te, Al—Te, Bi—Sb—Te (BST), In—Sb—Te (IST), Ge—Sb—Te, Te—Ge—As, Te—Sn—Se, Ge—Se—Ga, Bi—Se—Sb, Ga—Se—Te, Sn—Sb—Te, In—Sb—Ge, In—Ge—Te, Ge—Sn—Te, Ge—Bi—Te, Ge—Te—Se, As—Sb—Te, Sn—Sb—Bi, Ge—Te—O, Te—Ge—Sb—S, Te—Ge—Sn—O, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, Ge—Te—Sn—Pt, In—Sn—Sb—Te, or As—Ge—Sb—Te or a combination thereof.

Each of elements included in the variable resistance layer 132 may have various stoichiometry ratios. A crystallization temperature, a melting temperature, a phase change speed based on crystallization energy, and data retention characteristic of the variable resistance layer 132 may be adjusted based on the stoichiometry ratio of each element.

The variable resistance layer 132 may include at least one impurity, such as, carbon (C), nitrogen (N), silicon (Si), oxygen (O), bismuth (Bi), or tin (Sn). A driving current of the memory device 100 may be changed by the at least one impurity. The variable resistance layer 132 may include at least one metal. For example, the variable resistance layer 132 may include at least one of aluminium (Al), gallium (Ga), tin (Sn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), lead (Pb), titanium (Ti), or polonium (Po). The metal may increase the electrical conductivity and thermal conductivity of the variable resistance layer 132 and may thus increase a crystallization speed, thus increasing a set speed. The metal may increase the data retention characteristics of the variable resistance layer 132.

The variable resistance layer 132 may have a multilayer structure in which two or more layers having different physical properties are stacked. The number or thickness of the layers may be selected, as desired. A barrier layer may be formed between the layers. The barrier layer may prevent materials from being diffused between the layers. As an example, the barrier layer may decrease diffusion of a preceding layer when forming a subsequent layer among the layers.

The variable resistance layer 132 may have a super-lattice structure in which a plurality of layers including different materials are alternately stacked. For example, the variable resistance layer 132 may include a structure where a first layer including Ge—Te and a second layer including Sb—Te are alternately stacked. However, exemplary embodiments of the present inventive concept are not limited thereto, and a material of the first layer is not limited to Ge—Te, and a material of the second layer is not limited to Sb—Te. The first and second layers may each include the above-described various materials.

The variable resistance layer 132 has been described above as including a phase change material. However, exemplary embodiments of the present inventive concept are not limited thereto. For example, in an exemplary embodiment of the present inventive concept, the variable resistance layer 132 of the memory device 100 may include various materials having resistance-changing characteristic.

In some exemplary embodiments of the present inventive concept, when the variable resistance layer 132 includes transition metal oxide, the memory device 100 may be a resistive random access memory (ReRAM). In the variable resistance layer 132 including transition metal oxide, at least one electrical path may be formed or depleted in the variable resistance layer 132 through a program operation. When the electrical path is formed, the variable resistance layer 132 may have a low resistance value, and when the electrical path is depleted, the variable resistance layer 132 may have a high resistance value. The memory device 100 may store data by using a resistance value difference of the variable resistance layer 132.

When the variable resistance layer 132 includes transition metal oxide, the transition metal oxide may include at least one metal, such as, Ta, Zr, Ti, Hf, Mn, Y, Ni, Co, Zn, Nb, Cu, Fe, or Cr. For example, the transition metal oxide may have a single layer or a multilayer structure including at least one material selected from among $Ta_2O_{5-x}$, $ZrO_{2-x}$, $TiO_{2-x}$, $HfO_{2-x}$, $MnO_{2-x}$, $Y_2O_{3-x}$, $NiO_{1-y}$, $Nb_2O_{5-x}$, $CuO_{1-y}$, or $Fe_2O_{3-x}$. In the above-described materials, x may be selected within a range of $0 \leq x \leq 1.5$, and y may be selected within a range of $0 \leq y \leq 0.5$. However, exemplary embodiments of the present inventive concept are not limited thereto.

In an exemplary embodiment of the present inventive concept, when the variable resistance layer 132 has a magnetic tunnel junction (MJT) structure which includes two electrodes including a magnetic material and a dielectric disposed between the two magnetic electrodes, the memory device 100 may be a magnetic random access random (MRAM).

The two electrodes may respectively be a magnetization fixed layer and a magnetization free layer, and the dielectric disposed therebetween may be a tunnel barrier layer. The magnetization fixed layer may have a magnetization direction which is fixed in one direction, and the magnetization free layer may have a magnetization direction which is changeable to be parallel or antiparallel to the magnetization direction of the magnetization fixed layer. The magnetization directions of the magnetization fixed layer and the magnetization free layer may be parallel to one surface of the tunnel barrier layer, but exemplary embodiments of the present inventive concept are not limited thereto. In an exemplary embodiment of the present inventive concept, the magnetization directions of the magnetization fixed layer and the magnetization free layer may be perpendicular to the one surface of the tunnel barrier layer.

When the magnetization direction of the magnetization free layer is parallel to the magnetization direction of the magnetization fixed layer, the variable resistance layer 132 may have a first resistance value. When the magnetization direction of the magnetization free layer is antiparallel to the magnetization direction of the magnetization fixed layer, the variable resistance layer 132 may have a second resistance value. By using such a resistance value difference, the memory device 100 may store data. The magnetization direction of the magnetization free layer may be changed by a spin torque of electrons included in a program current.

The magnetization fixed layer and the magnetization free layer may each include a magnetic material. In this case, the magnetization fixed layer may further include an antiferromagnetic material that fixes a magnetization direction of a ferromagnetic material included in the magnetization fixed layer. The tunnel barrier layer may include at least one oxide, such as, Mg, Ti, Al, MgZn, or MgB, but exemplary embodiments of the present inventive concept are not limited thereto.

The selection device 134 may be a current control element for controlling a flow of a current. The selection device 134 may be, for example, a current control element having ovonic threshold switching (OTS) characteristic.

The selection device 134 may include a material having a resistance which varies according to a level of a voltage applied across both ends of the selection device 134, and for example, may include a material having the OTS characteristic. For example, when a voltage lower than a threshold voltage $V_T$ is applied to the selection device 134, the selection device 134 may be in the high resistance state, and when a voltage higher than the threshold voltage $V_T$ is applied to the selection device 134, the selection device 134 may be in the low resistance state and a current may start to flow. When the current flowing through the selection device 134 becomes lower than a holding current, the selection device 134 may be changed to the high resistance state. The OTS characteristic of the selection device 134 will be described below in more detail with reference to FIG. 5.

The selection device 134 may include a chalcogenide material as an OTS material layer. A representative example of the chalcogenide material may include one or more elements (e.g., an chalcogen element) from periodic table Group VI and may additionally include one or more chemical modifiers from Group III, IV or V. Exemplary chalcogen elements capable of being included in the selection device 134 may include sulfur (S), selenium (Se), or tellurium (Te). The chalcogen elements are characterized by including a divalent bonding and a lone pair electron. The divalent bonding leads to forming of a chain and ring structure by bonding chalcogen elements for forming a chalcogenide material, and the lone pair electron provides an electron source for forming a conductive filament. For example, trivalent and tetravalent modifiers such as Al, Ga, indium (In), germanium (Ge), Sn, Si, phosphorus (P), arsenic (As), or antimony (Sb) may be added into a chain and ring structure of a chalcogen element to determine a structural rigidity of a chalcogenide material and may classify the chalcogenide material into a switching material and a phase change material, based on a capability to perform crystallization or other structural rearrangement.

In some exemplary embodiments of the present inventive concept, the selection device 134 may include Si, Te, As, Ge, In, or a combination thereof. For example, the selection device 134 may include about 14% Si, about 39% Te, about 37% As, about 9% Ge, and about 1% In. A percentage ratio denotes an atomic percentage ratio where an atomic element is a total of 100%.

The selection device 134 may include Si, Te, As, Ge, S, Se, or a combination thereof. For example, the selection device 134 may include about 5% Si, about 34% Te, about 28% As, about 11% Ge, about 21% S, and about 1% Se.

The selection device 134 may include Si, Te, As, Ge, S, Se, Sb, or a combination thereof. For example, the selection device 134 may include about 21% Te, about 10% As, about 15% Ge, about 2% S, about 50% Se, and about 2% Sb.

In the memory device 100 according to an exemplary embodiment of the present inventive concept, the selection device 134 is not limited to the OTS material layer. For example, the selection device 134 may include various material layers having a function of selecting devices without being limited to the OTS material layer. For example, the selection device 134 may include a diode, tunnel junction, a PNP diode or a bipolar junction transistor (BJT), or may employ mixed ionic-electronic conduction (MIEC).

The bottom electrode BE may be disposed between the plurality of word lines 110 and the selection device 134. The middle electrode ME may be disposed between the selection device 134 and the variable resistance layer 132. The top electrode TE may be disposed between the variable resistance layer 132 and the plurality of bit lines 120.

In an exemplary embodiment of the present inventive concept, the bottom electrode BE, the middle electrode ME, and the top electrode TE may each include metal, conductive metal nitride, conductive metal oxide, or a combination thereof. At least one of the bottom electrode BE, the middle electrode ME, and the top electrode TE may include a conductive layer, including metal or conductive metal nitride, and at least one conductive barrier layer covering at least a portion of the conductive layer. The conductive barrier layer may include a metal oxide, metal nitride, or a combination thereof, but exemplary embodiments of the present inventive concept are not limited thereto.

In an exemplary embodiment of the present inventive concept, the top electrode TE or the middle electrode ME contacting the variable resistance layer 132 may include a conductive material that generates heat sufficient to phase-change the variable resistance layer 132. For example, the top electrode TE or the middle electrode ME may include a refractory metal such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof, a nitride thereof, or a carbon-based conductive material.

In an exemplary embodiment of the present inventive concept, a heater electrode may be disposed between the variable resistance layer 132 and the top electrode TE or between the variable resistance layer 132 and the middle electrode ME. The heater electrode may include a conductive material that generates heat sufficient to phase-change the variable resistance layer 132. For example, the heater electrode may include a refractory metal such as TiN, TiSiN, TiAlN, TaSiN, TaAlN, TaN, WSi, WN, TiW, MoN, NbN, TiBN, ZrSiN, WSiN, WBN, ZrAlN, MoAlN, TiAl, TiON, TiAlON, WON, TaON, C, SiC, SiCN, CN, TiCN, TaCN, or a combination thereof, a nitride thereof, or a carbon-based conductive material.

Referring to FIGS. 2 to 4, the variable resistance layer 132 may be disposed above the selection device 134 with the middle electrode ME disposed between the selection device 134 and the variable resistance layer 132, but exemplary embodiments of the present inventive concept are not limited thereto. According to an exemplary embodiment of the present inventive concept, the selection device 134 may be disposed above the variable resistance layer 132 with the middle electrode ME disposed between the variable resistance layer 132 and the selection device 134. The bottom electrode BE or the middle electrode ME contacting the variable resistance layer 132 may include a conductive material that generates heat sufficient to phase-change the variable resistance layer 132. The heater electrode may be disposed between the variable resistance layer 132 and the bottom electrode BE or between the variable resistance layer 132 and the middle electrode ME.

A plurality of capping layers 142 and 144 may be respectively formed on side walls of the plurality of memory cell pillars 130. A first capping layer 142 may be disposed on a side wall of the variable resistance layer 132, and a second capping layer 144 may be disposed on a side wall of the selection device 134.

In an exemplary embodiment of the present inventive concept, the first capping layer 142 may surround the side wall of the variable resistance layer 132 and may contact a bottom of the top electrode TE and a top of the middle electrode ME. Referring to FIG. 2, the first capping layer 142 may surround substantially the entire portion of the side wall of the variable resistance layer 132, but exemplary embodiments of the present inventive concept are not limited thereto.

The first capping layer 142 may include a pair of first portions 142X, which are disposed on the side wall of the variable resistance layer 132 and are spaced apart from each other along the second direction (e.g., the Y direction), and a pair of second portions 142Y which are disposed on the side wall of the variable resistance layer 132 and are spaced apart from each other along the first direction (e.g., the X direction). The pair of second portions 142Y may contact ends of the pair of first portions 142X, and the pair of first portions 142X and the pair of second portions 142Y may surround the side wall of the variable resistance layer 132.

Referring to FIG. 3, the pair of first portions 142X included in the first capping layer 142 may each include an outer wall 142X-OS and an inner wall 142X-IS which extend in the first direction (e.g., the X direction). The inner wall 142X-IS of the first capping layer 142 may contact the side wall of the variable resistance layer 132. In an exemplary embodiment of the present inventive concept, the inner wall 142X-IS of the first capping layer 142 may be substantially planar along a third direction (e.g., a Z direction) As an example, the inner wall 142X-IS of the first capping layer 142 may be vertically planar. The outer wall 142X-OS of the first capping layer 142 may be aligned with a side wall of the middle electrode ME. The outer wall 142X-OS of the first capping layer 142 may be aligned with the side wall of the middle electrode ME. An extension plane of the outer wall 142X-OS of the first capping layer 142 may be disposed on substantially a same plane as an extension plane of the side wall of the middle electrode ME.

Referring to FIG. 3, the pair of second portions 142Y included in the first capping layer 142 may each include an outer wall 142Y-OS and an inner wall 142Y-IS which extend in the second direction (e.g., the Y direction). The inner wall 142Y-IS of the first capping layer 142 contacting the side wall of the variable resistance layer 132 may be substantially planar along the third direction (e.g., the Z direction). As an example, the inner wall 142Y-IS of the first capping layer 142 contacting the side wall of the variable resistance layer 132 may be vertically planar. The outer wall 142Y-OS of the first capping layer 142 may be aligned with the side wall of the middle electrode ME.

In an exemplary embodiment of the present inventive concept, the second capping layer 144 may surround the side wall of the selection device 134 and may contact a bottom of the middle electrode ME and a top of the bottom electrode ME. Referring to FIG. 2, the second capping layer 144 may surround substantially the entire portion of the side wall of the selection device 134, but exemplary embodiments of the present inventive concept are not limited thereto.

The second capping layer 144 may include at least two third portions 144X, which are disposed on the side wall of the selection device 134 and are spaced apart from each other along the second direction (e.g., the Y direction), and at least two fourth portions 144Y which are disposed on the side wall of the selection device 134 and are spaced apart from each other along the first direction (e.g., the X direction). The fourth portions 144Y may contact ends of the pair of third portions 144X. The third portions 144X and the fourth portions 144Y may surround the side wall of the selection device 134.

Referring to FIG. 3, the pair of third portions 144X included in the second capping layer 144 may each include an outer wall 144X-OS and an inner wall 144X-IS which extend in the first direction (e.g., the X direction). The inner wall 144X-IS of the second capping layer 144 may contact the side wall of the selection device 134. In an exemplary embodiment of the present inventive concept, the inner wall 144X-IS of the second capping layer 144 may be substantially planar along the third direction (e.g., the Z direction). As an example, the inner wall 144X-IS of the second capping layer 144 may be vertically planar. The outer wall 144X-OS of the second capping layer 144 may be aligned with the side wall of the middle electrode ME.

The fourth portions 144Y included in the second capping layer 144 may each include an outer wall 144Y-OS and an inner wall 144Y-IS which extend in the second direction (e.g., the Y direction). The inner wall 144Y-IS of the second capping layer 144 contacting the side wall of the selection device 134 may be substantially planar along the third direction (e.g., the Z direction). The outer wall 144Y-OS of the second capping layer 144 may be aligned with the side wall of the middle electrode ME.

In an exemplary embodiment of the present inventive concept, the first capping layer 142 and the second capping layer 144 may each include silicon nitride or silicon oxynitride. However, a material of each of the first capping layer 142 and the second capping layer 144 is not limited thereto. The first capping layer 142 and the second capping layer 144 may surround the side walls of the variable resistance layer 132 and the selection device 134, respectively. The first capping layer 142 and the second capping layer 144 may each act as a passivation layer that prevents the variable resistance layer 132 and the selection device 134 from being oxidized or damaged due to being exposed in a process of manufacturing the memory device 100, such as, in a process of etching underlying layers or a process of forming an insulation layer.

A plurality of first insulation patterns 150 may be respectively disposed between a plurality of memory cell pillars 130, arranged in a row along the second direction (e.g., the Y direction). A plurality of second insulation patterns 160 may be respectively disposed between a plurality of memory cell pillars 130, arranged in one row along the first direction (e.g., the X direction).

Referring to FIGS. 2 to 4, the plurality of second insulation patterns 160 may be line-type patterns which are spaced apart from each other in the first direction and extend along the second direction. The plurality of first insulation patterns 150 may be island-type patterns which are respectively disposed between a plurality of memory cell pillars 130, between two adjacent second insulation patterns 160 among the plurality of second insulation patterns 160. However, exemplary embodiments of the present inventive concept are not limited thereto According to an exemplary embodiment of the present inventive concept, the plurality of first insulation patterns 150 may be line-type patterns which extend along the second direction, and the plurality of second insulation patterns 160 may be island-type patterns which are spaced apart from each other along the first direction and the second direction. According to an exemplary embodiment of the present inventive concept, the plurality of first insulation patterns 150 may be island-type patterns which are spaced apart from each other along the first direction and the second direction, and the plurality of second insulation patterns 160 may be line-type patterns which extend along the first direction.

In an exemplary embodiment of the present inventive concept, the plurality of first insulation patterns 150 and the plurality of second insulation patterns 160 may each include a material which is lower in dielectric constant than the capping layers 142 and 144. For example, the plurality of first insulation patterns 150 and the plurality of second insulation patterns 160 may each include a silicon oxide, such as, BPSG, PSG, USG, FSG, SOG, FOX, TEOS, PE-TEOS, HDP-CVD oxide, FSG, or SiOC.

Referring to FIG. 3, the middle electrode ME may have a first width W1 in the second direction (e.g., the Y direction). A second width W2 of the variable resistance layer 132 in the second direction may be less than the first width W1 of the middle electrode ME. A third width W3 of the selection device 134 in the second direction may be less than the first width W1 of the middle electrode ME. The first width W1 of the middle electrode ME may be from about 10 nm to about 200 nm, but exemplary embodiments of the present inventive concept are not limited thereto. The second width W2 of the variable resistance layer 132 and the third width W3 of the selection device 134 may be from about 5 nm to about 180 nm, but exemplary embodiments of the present inventive concept are not limited thereto. The first width W1 of the middle electrode ME, the second width W2 of the variable resistance layer 132, and the third width W3 of the selection device 134 and/or thicknesses of the middle electrode ME, the variable resistance layer 132, and the selection device 134 may be selected based on a degree of integration of the memory device 100, a resolution limitation of a photolithography process, and a threshold voltage of the selection device 134.

In an exemplary embodiment of the present inventive concept, the first capping layer 142 may have a fourth width W4 in the second direction (e.g., the Y direction), and the second capping layer 144 may have a fifth width W5 equal to the fourth width W4 in the second direction. For example, the fourth width W4 and the fifth width W5 may be from about 2 nm to about 50 nm. However, exemplary embodiments of the present inventive concept are not limited thereto. According to an exemplary embodiment of the present inventive concept, the fourth width W4 of the first capping layer 142 may differ from the fifth width W5 of the second capping layer 144.

Generally, in a process of forming the plurality of memory cell pillars 130 (for example, a process of etching the plurality of memory cell pillars 130, a process of etching the word lines 110 or the bit lines 120, or a process of forming the plurality of insulation patterns 150 and 160), when the variable resistance layer 132 including the phase material layer and the selection device 134 including the material having the OTS characteristic are exposed to an atmosphere (e.g., air), damage such as being oxidized may occur in the variable resistance layer 132 and the selection device 134. A passivation layer including silicon nitride may surround a side wall of each of the plurality of memory cell pillars 130, and thus damage, such as oxidation, may be reduced or eliminated. However, in a memory device including a crosspoint structure, as a width of each of the memory cell pillars 130 is reduced, an interval between the memory cell pillars 130 may also be reduced. In this case, the passivation layer may fully fill the interval between the memory cell pillars 130. However, due to the passivation layer which has a high dielectric constant generally, considerable RC delay may occur in driving the memory device.

However, in the memory device 100 according to an exemplary embodiment of the present inventive concept, the capping layers 142 and 144 having a relatively thin thickness may be disposed on only the side walls of the variable resistance layer 132 and the selection device 134, and the plurality of insulation patterns 150 and 160 may be disposed between the memory cell pillars 130. The plurality of insulation patterns 150 and 160 may include a material having a dielectric constant which is lower than that of each of the capping layers 142 and 144. Thus, RC delay which occurs in driving the memory device 100 may be reduced or eliminated, thus enabling the memory device 100 to operate at a high speed.

In the memory device 100 according to an exemplary embodiment of the present inventive concept, since the capping layers 142 and 144 having a relatively thin thickness are disposed on only the side walls of the variable resistance layers 132 and the selection devices 134, damage to the variable resistance layers 132 and the selection devices 134 may be reduced or prevented in a process of manufacturing the memory device 100. Thus, reliability of the memory device 100 may be increased.

In the memory device 100 according to an exemplary embodiment of the present inventive concept, the selection device 134 having the OTS characteristic may be used. An OTS device may include a chalcogen compound which has an amorphous state in an on state and an off state. As an example, the OTS device may be repeatedly shifted between the off state corresponding to a relatively low resistance and the on state corresponding to a relatively high resistance by applying a voltage or a current without any change in phase of the chalcogen compound. Thus, the OTS device may have relatively high endurance (e.g., relatively high cycle characteristic and reliability). Even when a degree of integration of the memory device 100 is relatively high, such as, when the memory device 100 is down-scaled, the selection device 134 in each of the memory cell pillars 130 may have a uniform threshold voltage distribution. A switching operation of the OTS device will be described in more detail below with reference to FIG. 5.

Figure 5:
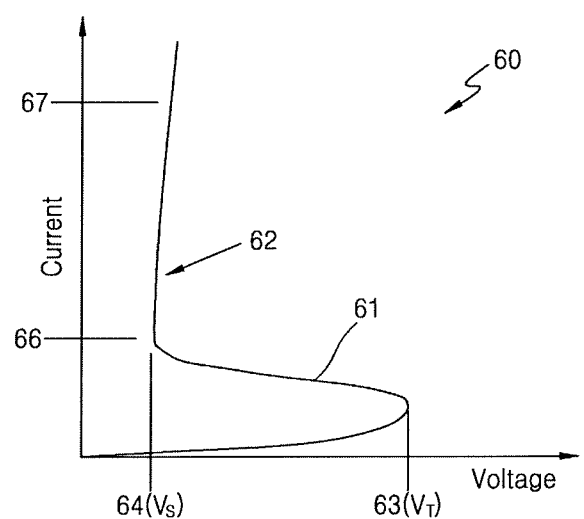
FIG. 5 is a graph schematically showing a voltage-current curve of an ovonic threshold switching (OTS) device having OTS characteristic.

FIG. 5 is a graph schematically showing a voltage-current curve 60 of an OTS device having OTS characteristic. FIG. 5 schematically shows a current which flows in the OTS device according to a voltage applied across both ends of the OTS device having the OTS characteristic.

Referring to FIG. 5, a first curve 61 represents a voltage-current relationship in a state where a current does not flow in an OTS device. The OTS device may act as a switching device having a threshold voltage $V_T$ which is at a first voltage level 63. When a voltage gradually increases from a state where the voltage and the current are 0, the current hardly flows in the OTS device until the voltage reaches the threshold voltage $V_T$ (e.g., the first voltage level 63). However, as soon as the voltage exceeds the threshold voltage $V_T$, the current flowing in the OTS device may rapidly increase, and the voltage applied to the OTS device may decrease to a second voltage level 64 (e.g., a saturation voltage $V_S$).

A second curve 62 represents a voltage-current relationship in a state where a current flows in the OTS device. As the current flowing in the OTS device has a level higher than a first current level 66, a voltage applied to the OTS device may slightly further increase than the second voltage level 64. For example, while the current flowing in the OTS device is increasing from the first current level 66 to a second current level 67, the voltage applied to the OTS device may slightly increase from the second voltage level 64. As an example, once the current flows through the OTS device, the voltage applied to the OTS device may be substantially maintained as the saturation voltage $V_S$ e.g., the second voltage level 64). For example, when the current decreases to less than a holding current level (e.g., the first current level 66), the OTS device may be changed to a resistance state and may effectively block the current until the voltage increases to the threshold voltage $V_T$.

Figure 6:
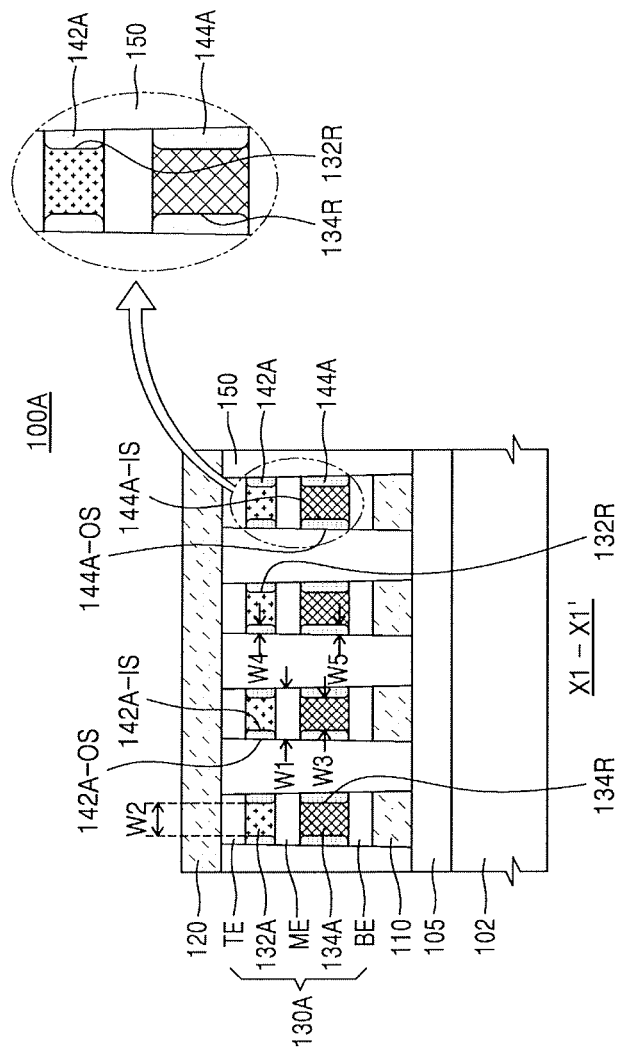
FIG. 6 is a cross-sectional view illustrating a memory device according to an exemplary embodiment of the present inventive concept.

FIG. 6 is a cross-sectional view illustrating a memory device according to an exemplary embodiment of the present inventive concept. Referring to FIG. 6, like reference numerals may refer to like components described with reference to FIGS. 1 to 5 and thus duplicative descriptions may be omitted.

FIG. 6 illustrates a cross-sectional view corresponding to a cross-sectional view taken along line X1-X1' of FIG. 2. Except for a shape of each of a first capping layer 142A and a second capping layer 144A, a memory device 100a described with reference to FIG. 6 may be substantially the same as the memory device 100 described with reference to FIGS. 2 to 4.

Referring to FIG. 6, a plurality of memory cell pillars 130A may each include a variable resistance layer 132A, including a recessed portion 132R disposed in a side wall of the variable resistance layer 132A, and a selection device 134A including a recessed portion 134R disposed in a side wall of the selection device 134A.

The side wall of the variable resistance layer 132A may include the recessed portion 132R recessed toward an inner side, and thus, a second width W2 of the variable resistance layer 132A may gradually decrease in a direction from an upper side to a center portion and may gradually increase in a direction from the center portion to a lower side. Referring to FIG. 6, a tail may extend toward an outer side and may be formed in an uppermost side wall of the variable resistance layer 132A. A tail may be formed in a lowermost side wall of the variable resistance layer 132A.

The side wall of the selection device 134A may include the recessed portion 134R recessed toward an inner side, and thus, a third width W3 of the selection device 134A may gradually decrease in a direction from an upper side to a center portion and may gradually increase in a direction from the center portion to a lower side. Referring to FIG. 6, a tail may extend toward an outer side may be formed in an uppermost side wall of the selection device 134A. A tail may be formed in a lowermost side wall of the selection device 134A. The first capping layer 142A may surround the recessed portion 132R of the variable resistance layer 132A. An outer wall 142A-OS of the first capping layer 142A may be aligned with a side wall of a middle electrode ME and may be substantially planar in a vertical direction (e.g., a Z direction). Alternatively, the outer wall 142A-OS of the first capping layer 142A may be inclined at an angle with respect to the vertical direction. An inner wall 142A-IS of the first capping layer 142A may be a rounded side wall which contacts the recessed portion 132R of the variable resistance layer 132A and protrudes in a direction toward the variable resistance layer 132A.

The second capping layer 144A may surround the recessed portion 134R of the selection device 134A. An outer wall 144A-OS of the second capping layer 144A may be aligned with the side wall of the middle electrode ME and may be substantially planar in the vertical direction (e.g., the Z direction). Alternatively, the outer wall 144A-OS of the second capping layer 144A may be inclined at an angle with respect to the vertical direction. An inner wall 144A-IS of the second capping layer 144A may be a rounded side wall which contacts the recessed portion 134R of the selection device 134A and protrudes in a direction toward the selection device 134A.

In an exemplary embodiment of the present inventive concept, the recessed portion 132R of the variable resistance layer 132A and the recessed portion 134R of the selection device 134A may be formed by an isotropic etching process for the variable resistance layer 132A and the selection device 134A. The first capping layer 142A and the second capping layer 144A may fill a portion of the variable resistance layer 132A and a portion of the selection device 134A which are removed by the isotropic etching process, and thus, the first capping layer 142A and the second capping layer 144A may respectively fill the rounded inner wall 142A-IS and the rounded inner wall 144A-IS.

Exemplary profiles of the recessed portion 132R of the variable resistance layer 132A and a profile of the recessed portion 134R of the selection device 134A are illustrated in FIG. 6. However, exemplary embodiments of the present inventive concept are not limited thereto. The profile of the recessed portion 132R of the variable resistance layer 132A and the profile of the recessed portion 134R of the selection device 134A may be changed based on materials of the variable resistance layer 132A and the selection device 134A, heights of the variable resistance layer 132A and the selection device 134A, and an etch recipe applied to the isotropic etching process for the variable resistance layer 132A and the selection device 134A.

According to an exemplary embodiment of the present inventive concept, when a first isotropic etching process for the variable resistance layer 132A and a second isotropic etching process for the selection device 134A are separately performed, the profile of the recessed portion 132R of the variable resistance layer 132A may differ from the profile of the recessed portion 134R of the selection device 134A. For example, when an etch rate of the first isotropic etching process differs from an etch rate of the second isotropic etching process, for example, the side wall of the variable resistance layer 132A may include the recessed portion 132R which is approximately vertically planar, and a slope angle of the recessed portion 134R of the selection device 134A may be greater than illustrated in FIG. 6. According to an exemplary embodiment of the present inventive concept, even when the isotropic etching process for the variable resistance layer 132A and the isotropic etching process for the selection device 134A are substantially simultaneously performed, the profile of the recessed portion 132R of the variable resistance layer 132A may differ from the profile of the recessed portion 134R of the selection device 134A, based on materials and/or a height difference of the variable resistance layer 132A and the selection device 134A.

Figure 7:
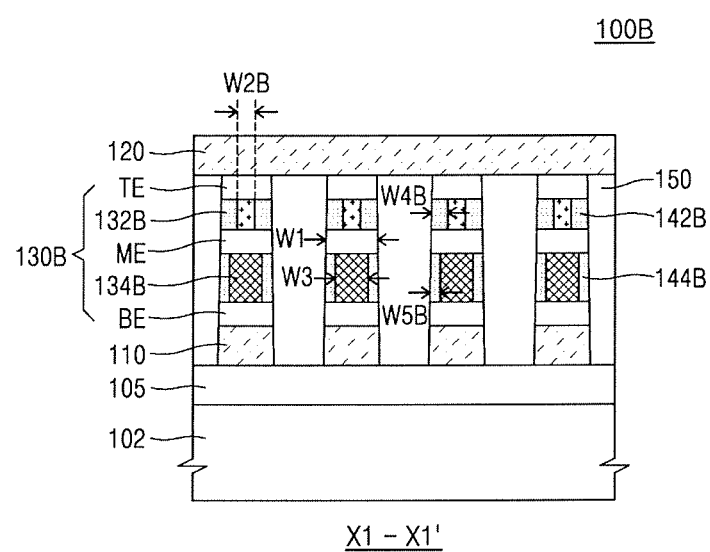
FIG. 7 is a cross-sectional view illustrating a memory device according to an exemplary embodiment of the present inventive concept.

FIG. 7 is a cross-sectional view illustrating a memory device according to an exemplary embodiment of the present inventive concept. Referring to FIG. 7, like reference numerals may refer to like components described with reference to FIGS. 1 to 6 and thus duplicative descriptions may be omitted.

FIG. 7 illustrates a cross-sectional view corresponding to a cross-sectional view taken along line X1-X1' of FIG. 2. Except for a shape of each of a first capping layer 142B and a second capping layer 144B, a memory device 100b described with reference to FIG. 7 may be substantially the same as the memory device 100 described with reference to FIGS. 2 to 4.

Referring to FIG. 7, a plurality of memory cell pillars 130B may each include a variable resistance layer 132B, having a second width W2B in a second direction (e.g., a Y direction), and a selection device 134B having a third width W3B different from the second width W2B. A fourth width W4B of the first capping layer 142B, contacting the variable resistance layer 132B, in the second direction (e.g., the Y direction) may differ from a fifth width W5B of the second capping layer 144B, contacting the selection device 134B, in the second direction.

For example, the second width W2B of the variable resistance layer 132B may be less than the third width W3B of the selection device 134B. When the second width W2B of the variable resistance layer 132B is less than the third width W3B of the selection device 134B, a heat collection effect may increase, and thus, a reset current of the memory device 100B may be reduced (e.g., or a "reset" operation may be performed at a relatively low reset current). When the second width W2B of the variable resistance layer 132B is relatively small, thermal crosstalk (e.g., or thermal interference) in which heat which is generated in a "write" operation for an arbitrary variable resistance layer 132B and which may affect an adjacent variable resistance layer 132B, may be reduced or prevented.

However, exemplary embodiments of the present inventive concept are not limited thereto, and the second width W2B of the variable resistance layer 132B may be greater than the third width W3B of the selection device 134B.

Figure 8:
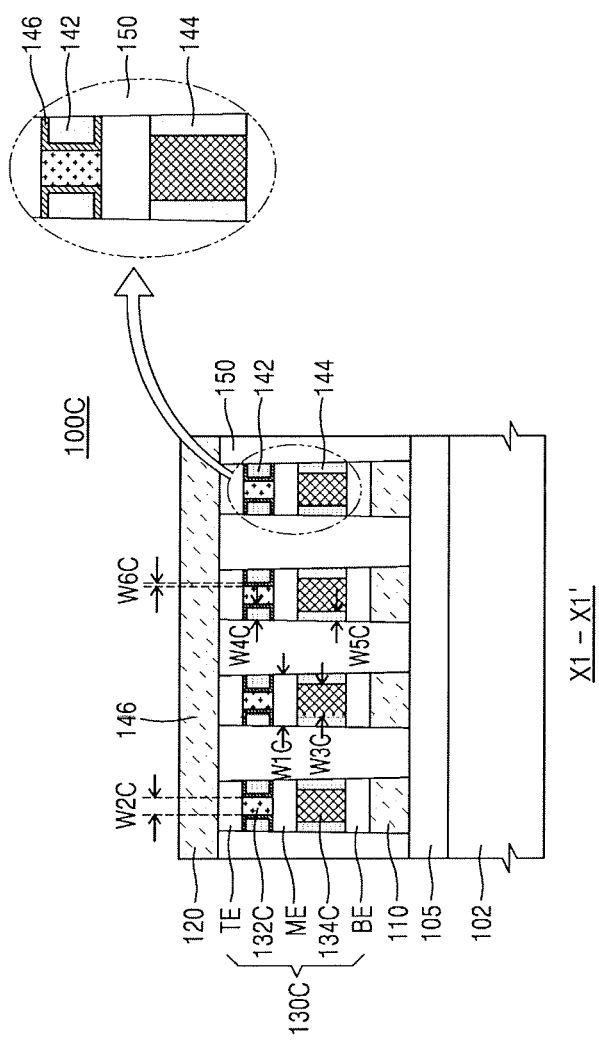
FIG. 8 is a cross-sectional view illustrating a memory device according to an exemplary embodiment of the present inventive concept.

FIG. 8 is a cross-sectional view illustrating a memory device according to an exemplary embodiment of the present inventive concept. FIG. 8 illustrates a cross-sectional view corresponding to a cross-sectional view taken along line X1-X1' of FIG. 2.

Referring to FIG. 8, in a memory device 100c according to an exemplary embodiment of the present inventive concept, a plurality of memory cell pillars 130C may each include an insulation liner 146 disposed between a variable resistance layer 132C and the first capping layer 142. The insulation liner 146 may extend to a bottom of the first capping layer 142 and a bottom of a top electrode TE and may also extend to a top of the first capping layer 142 and a top of a middle electrode ME. The insulation liner 146 need not be disposed between a selection device 134C and a second capping layer 144.

In an exemplary embodiment of the present inventive concept, the insulation liner 146 may include silicon oxynitride or silicon nitride and may have a sixth width W6C of from about 1 nm to about 20 nm. However, exemplary embodiments of the present inventive concept are not limited thereto.

In a process of forming the plurality of memory cell pillars 130C according to an exemplary embodiment of the present inventive concept, the insulation liner 146 having a predetermined thickness may be first formed on a side wall of the variable resistance layer 132C, and then, the first and second capping layers 142 and 144 may be substantially simultaneously formed on the insulation liner 146 and a selection device 134C. A fourth width W4C of the first capping layer 142 may be substantially the same as a fifth width W5C of the second capping layer 144. In this case, by adjusting the sixth width W6C of the insulation liner 146, a second width W2C of the variable resistance layer 132C may be formed less than a third width W3C of the selection device 134C. Thus, the heat collection effect in the plurality of memory cell pillars 130C may be increased, and thus, a reset current of the memory device 100C may be reduced.

However, exemplary embodiments of the present inventive concept are not limited thereto. According to an exemplary embodiment of the present inventive concept, the first capping layer 142 may be first formed on the insulation liner 146, and then, the second capping layer 144 may be formed on the selection device 134C.

According to an exemplary embodiment of the present inventive concept, when the insulation liner 146 might be formed on only the side wall of the variable resistance layer 132C. According to an exemplary embodiment of the present inventive concept, when the variable resistance layer 132C is disposed under the selection device 134C, the insulation liner 146 may be formed on only a side wall of the selection device 134C. In an exemplary embodiment of the present inventive concept, the variable resistance layer 132C may be disposed on the selection device 134C, and the insulation liner 146 may be formed on only the side wall of the selection device 134C. The insulation liner 146 may be formed on all the side walls of the variable resistance layer 132C and the selection device 134C.

Figure 9:
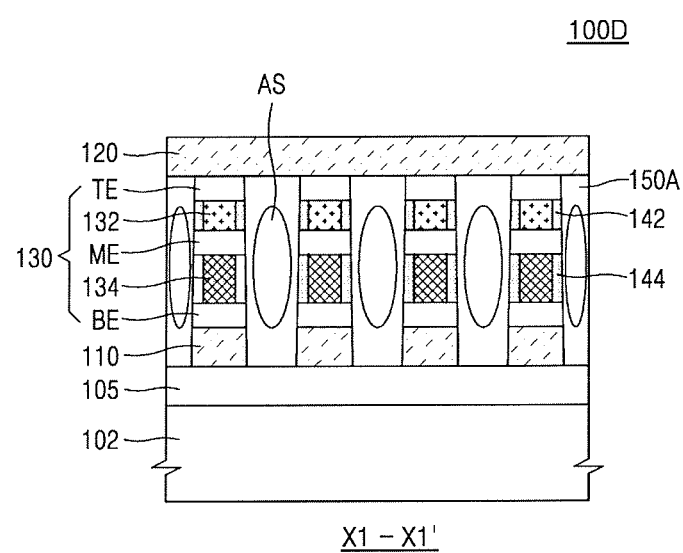
FIG. 9 is a cross-sectional view illustrating a memory device according to an exemplary embodiment of the present inventive concept.

FIG. 9 is a cross-sectional view illustrating a memory device according to an exemplary embodiment of the present inventive concept. FIG. 9 illustrates a cross-sectional view corresponding to a cross-sectional view taken along line X1-X1' of FIG. 2.

Referring to FIG. 9, in a memory device 100D according to an exemplary embodiment of the present inventive concept, an air spacer AS may be formed in a plurality of first insulation patterns 150A. The air spacer AS may also be formed in a plurality of second insulation patterns 160 (see, e.g., the second insulation patterns 160 illustrated in FIG. 2).

In an exemplary embodiment of the present inventive concept, the plurality of first insulation patterns 150A may include an insulating material such as silicon oxide. For example, the insulating material might not fully fill a space between the memory cell pillars 130 in a process of forming the plurality of first insulation patterns 150A, and thus the air spacer AS may be formed in the insulating material.

In an exemplary embodiment of the present inventive concept, the plurality of first insulation patterns 150A may have a relatively thin thickness and may conformally cover a side wall of each of the memory cell pillars 130. A sacrificial layer filling the space between the memory cell pillars 130 may be formed on the plurality of first insulation patterns 150A, and then, the air spacer AS may be formed in the plurality of first insulation patterns 150A by selectively removing the sacrificial layer through an ashing process and/or a strip process.

The air spacer AS may be lower in dielectric constant than the first and second capping layers 142 and 144. Thus, RC delay which may occur in driving the memory device 100D may be reduced, and thus the memory device 100D may operate at a relatively high speed.

Figure 10:
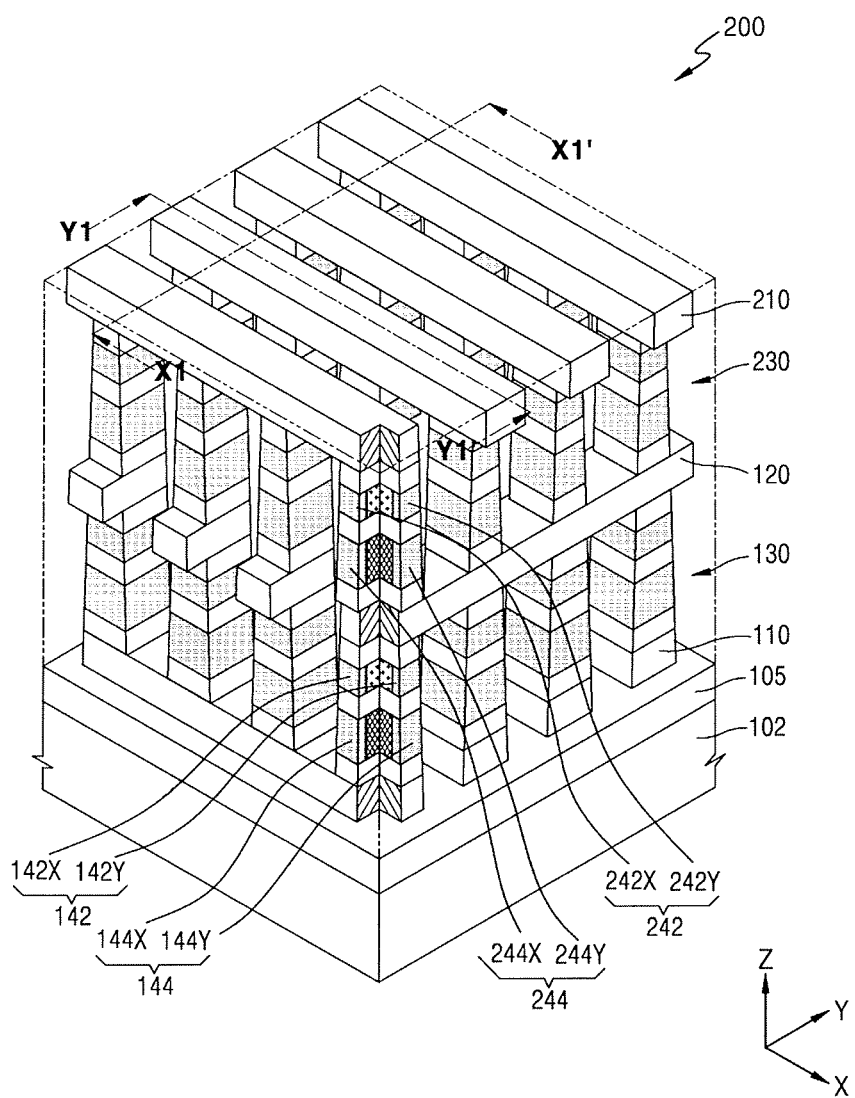
FIG. 10 is a perspective view illustrating a memory device according to an exemplary embodiment of the present inventive concept.
Figure 11:
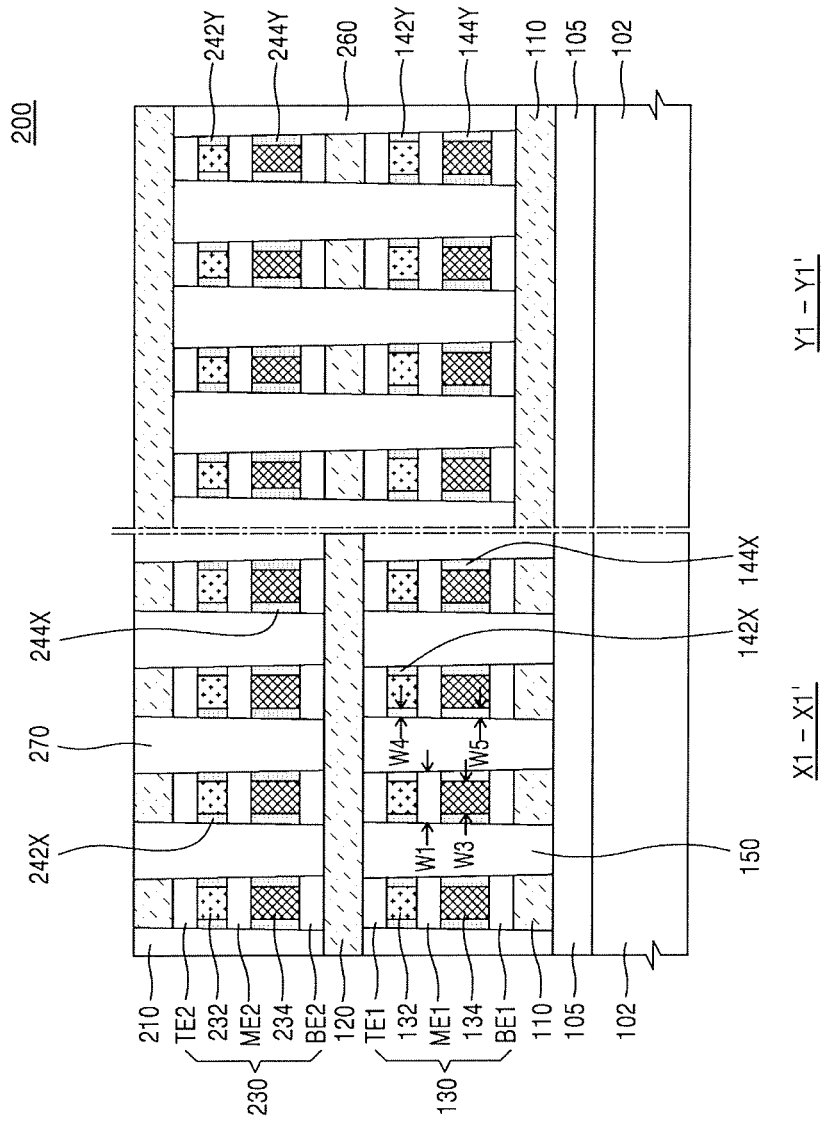
FIG. 11 is a cross-sectional view taken along line X1-X1' and line Y1-Y1' of FIG. 10.
Figure 12:
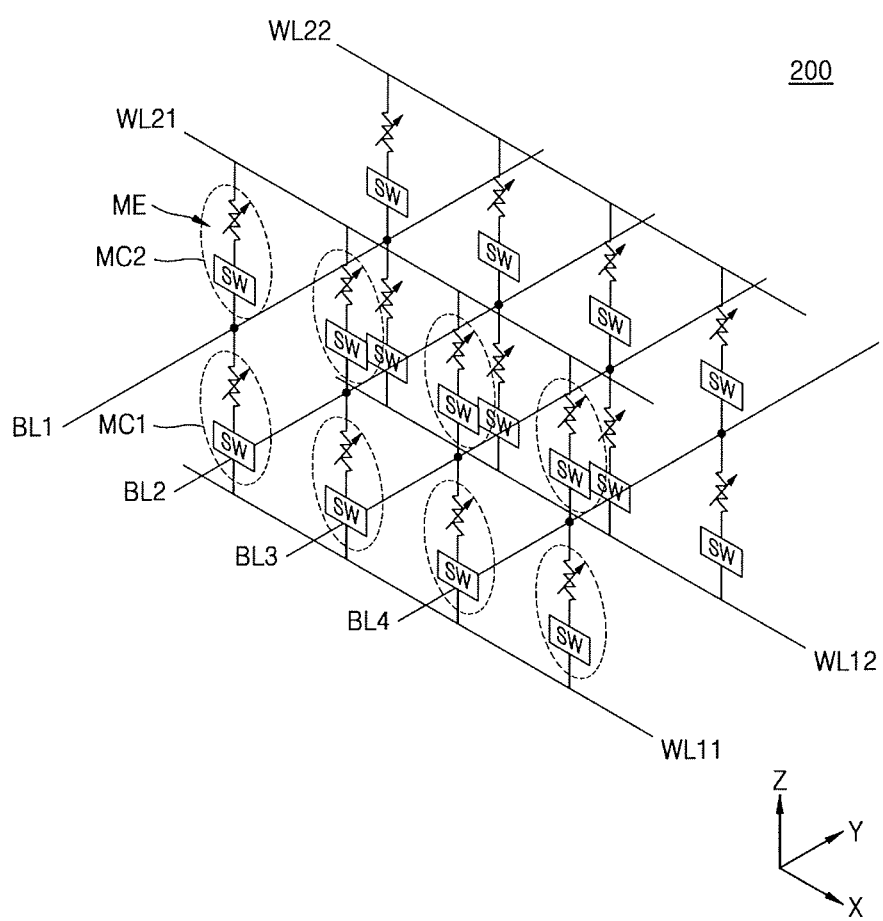
FIG. 12 is an equivalent circuit diagram of a memory device according to an exemplary embodiment of the present inventive concept.

FIG. 10 is a perspective view illustrating a memory device according to an exemplary embodiment of the present inventive concept. FIG. 11 is a cross-sectional view taken along line X1-X1' and line Y1-Y1' of FIG. 10. FIG. 12 is an equivalent circuit diagram of a memory device according to an exemplary embodiment of the present inventive concept.

Referring to FIGS. 10 to 12, a memory device 200 may include bottom word lines 110 (e.g., word lines WL11 and WL12), which may extend along a first direction (e.g., an X direction), and top word lines 210 (e.g., word lines WL21 and WL22) which extend along the first direction (e.g., the X direction in FIG. 10) and are spaced apart from the bottom word lines 110 in a third direction (e.g., a Z direction) perpendicular to the first direction above the bottom word lines 110. The memory device 200 may include common bit lines 120 (e.g., bit lines BL1 to BL4) which extend along a second direction (e.g., a Y direction) and are spaced apart from the top word lines 210 and the bottom word lines 110 in the third direction.

A first memory unit 130 (MC1) may be disposed between the common bit lines 120 and the bottom word lines 110. A second memory unit 230 (MC2) may be disposed between the common bit lines 120 and the top word line 210. A selection device SW and a variable resistance layer ME may be serially connected to each other in the first memory unit 130 (MC1) and the second memory unit 230 (MC2).

Referring to FIG. 11, a plurality of insulation patterns 260 may be respectively disposed between the first and second memory units 130 and 230.

The first memory unit 130 (MC1) and the second memory unit 230 (MC2) may have characteristics similar to those of the memory cell pillars 130 described above with reference to FIGS. 2 to 4.

The first memory unit 130 may include a first bottom electrode BE1, a first selection device 134, a first middle electrode ME1, a first variable resistance layer 132, and a first top electrode TE1 which are sequentially disposed at a cross point between the common bit lines 120 and the bottom word lines 110. A first capping layer 142X and 142Y may be formed on a side wall of the first variable resistance layer 132, and a second capping layer 144X and 144Y may be formed on a side wall of the first selection device 134. According to an exemplary embodiment of the present inventive concept, the positions of the first selection device 134 and the first variable resistance layer 132 may be reversed in the first memory unit 130.

The second memory unit 230 may include a second bottom electrode BE2, a second selection device 234, a second middle electrode ME2, a second variable resistance layer 232, and a second top electrode TE2 which are sequentially disposed at a cross point between the common bit lines 120 and the top word lines 210. A third capping layer 242 including capping layers 242X and 242Y may be formed on a side wall of the second variable resistance layer 232, and a fourth capping layer 244 including capping layers 244X and 244Y may be formed on a side wall of the second selection device 234. According to an exemplary embodiment of the present inventive concept, the dispositions of the second selection device 234 and the second variable resistance layer 232 may be reversed in the second memory unit 230.

Referring to FIGS. 10 to 12, the memory device 200 may have a cross-point array structure where the first memory unit 130 and the second memory unit 230 are respectively stacked under and on the common bit line 120 according to an exemplary embodiment of the present inventive concept. However, exemplary embodiments of the present inventive concept are not limited thereto. According to an exemplary embodiment of the present inventive concept, the memory device 200 may have a structure in which the first memory unit 130 and the second memory unit 230 are respectively stacked under and on a common word line.

According to an exemplary embodiment of the present inventive concept, an insulation layer may be formed on the top word line 210, and a stacked structure including the bottom word line 110, the common bit line 120, the top word line 210, the first memory unit 130, and the second memory unit 230 may be formed on the insulation layer. As an example, two or more the stacked structures may be disposed in the third direction (e.g., the Z direction) with the insulation layer disposed between the two or more stacked structures.

Figure 13:
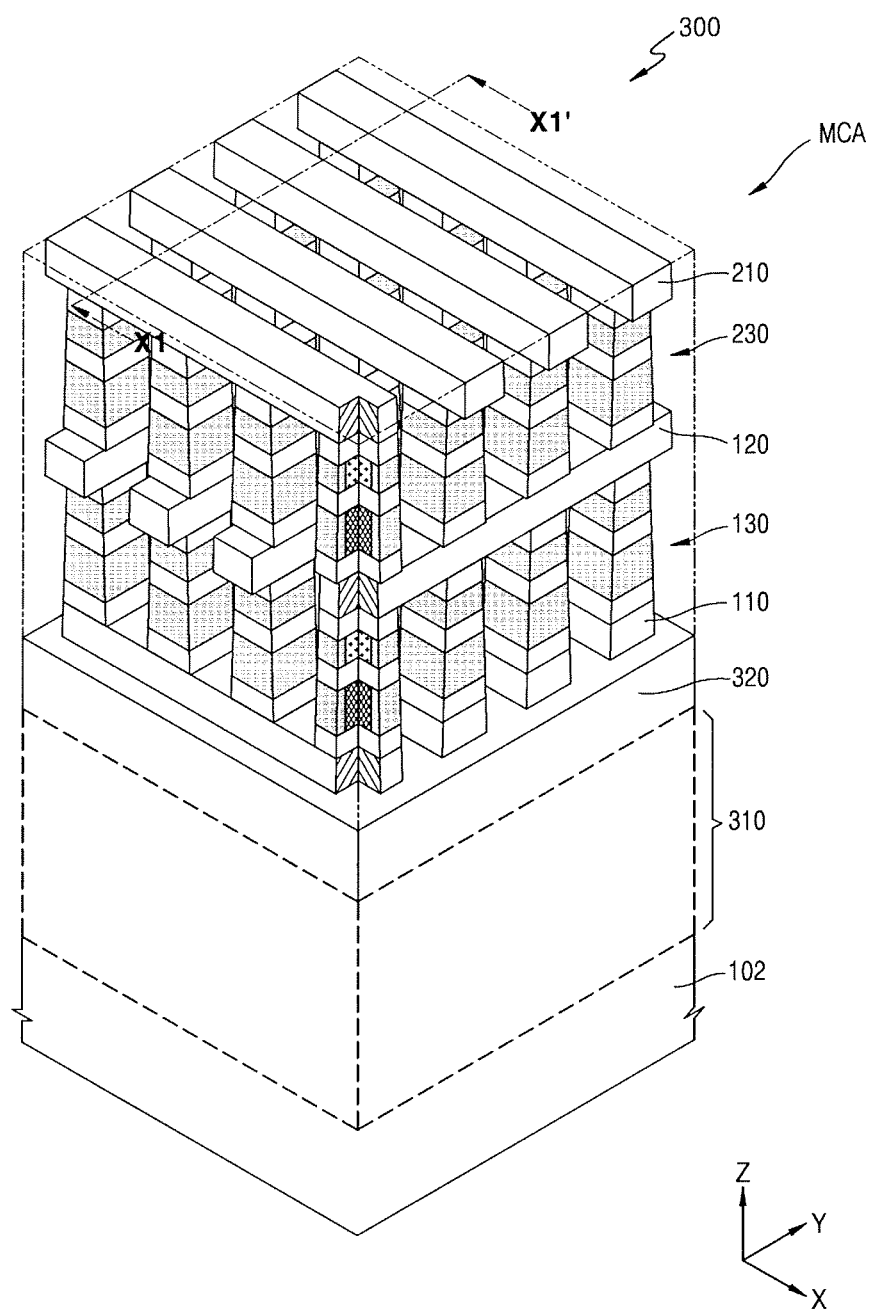
FIG. 13 is a perspective view illustrating a memory device according to an exemplary embodiment of the present inventive concept.
Figure 14:
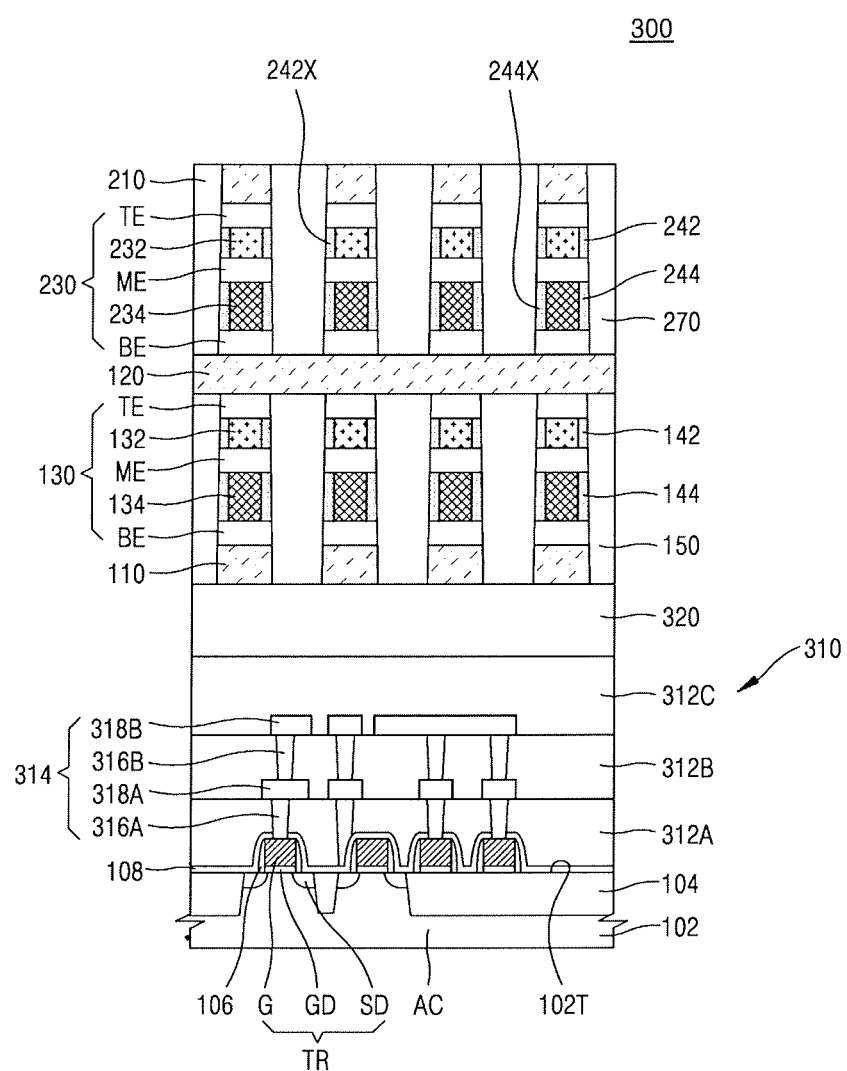
FIG. 14 is a cross-sectional view taken along line X1-X1 of FIG. 13.

FIG. 13 is a perspective view illustrating a memory device according to an exemplary embodiment of the present inventive concept. FIG. 14 is a cross-sectional view taken along line X1-X1 of FIG. 13.

Referring to FIGS. 13 and 14, a memory device 300 may include a driving circuit area 310 in a first level above a substrate 102, and a memory cell array area MCA in a second level above the substrate 102.

The term "level" denotes a height in a vertical direction (e.g., a Z direction) from the substrate 102. The first level above the substrate 102 may be closer to the substrate 102 than the second level above the substrate 102.

The driving circuit area 310 may include areas where peripheral circuits or driving circuits for driving memory cells in the memory cell array area MCA are disposed. For example, the peripheral circuits disposed in the driving circuit area 310 may be circuits for processing data input/output to/from the memory cell array area MCA at a relatively high speed. For example, the peripheral circuits may be a page buffer, a latch circuit, a cache circuit, a column decoder, a sense amplifier, a data in/out circuit, and/or a row decoder.

An active area AC for driving circuits may be defined on the substrate 102 by an isolation layer 104. A plurality of transistors TR configuring the driving circuit area 310 may be formed in the active area AC of the substrate 102. The plurality of transistors TR may each include a gate G, a gate insulation layer GD, and a source/drain area SD. Side walls of the gate G may be covered by an insulation spacer 106, and an etch stopper 108 may be formed on the gate G and the insulation spacer 106. The etch stopper 108 may include an insulating material such as silicon nitride, or silicon oxynitride.

A plurality of insulating interlayers 312A, 312B and 312C may be sequentially stacked on the etch stopper 108. The plurality of insulating interlayers 312A, 312B and 312C may each include silicon oxide, silicon oxynitride, and/or silicon nitride.

The driving circuit area 310 may include a multilayer wiring structure 314 electrically connected to the plurality of transistors TR. The multilayer wiring structure 314 may be insulated from the plurality of insulating interlayers 312A, 312B and 312C.

The multilayer wiring structure 314 may include a first contact 316A, a first wiring layer 318A, a second contact 316B, and a second wiring layer 318B which are sequentially stacked on the substrate 102 and are electrically connected to each other. In an exemplary embodiment of the present inventive concept, the first wiring layer 318A and the second wiring layer 318B may each include metal, conductive metal nitride, metal silicide, or a combination thereof. For example, the first wiring layer 318A and the second wiring layer 318B may each include a conductive material such as tungsten (W), molybdenum (Mo), titanium (Ti), cobalt (Co), tantalum (Ta), nickel (Ni), tungsten silicide, titanium silicide, cobalt silicide, or nickel silicide.

Referring to FIG. 14, according to an exemplary embodiment of the present inventive concept, the multilayer wiring structure 314 may have a two-layer wiring structure including the first wiring layer 318A and the second wiring layer 318B, but exemplary embodiments of the present inventive concept are not limited thereto. For example, the multilayer wiring structure may have a multilayer wiring structure including three or more layers, based on a layout of the driving circuit area 310 and the kind and arrangement of the gate G.

A top insulating interlayer 320 may be formed on the plurality of insulating interlayers 312A to 312C. The memory cell array area MCA may be disposed on the top insulating interlayer 320. The memory devices 100, 100A, 100B, 100C, 100D or 200 described in more detail above with reference to FIGS. 1 to 12 or a combination thereof may be disposed in the memory cell array area MCA.

A wiring structure connected between the memory cell array area MCA and the driving circuit area 310 may pass through the top insulating interlayer 320.

In the memory device 300 according to an exemplary embodiment of the present inventive concept, since the memory cell array area MCA may be disposed on the driving circuit area 310, a degree of integration of the memory device 300 may be increased.

Figure 15A:
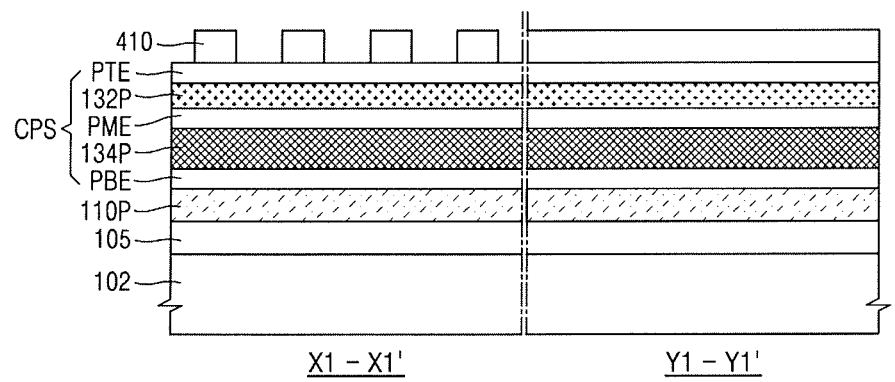
FIGS. 15A to 15O are cross-sectional views illustrating a method of manufacturing a memory device according to an exemplary embodiment of the present inventive concept.
Figure 15B:
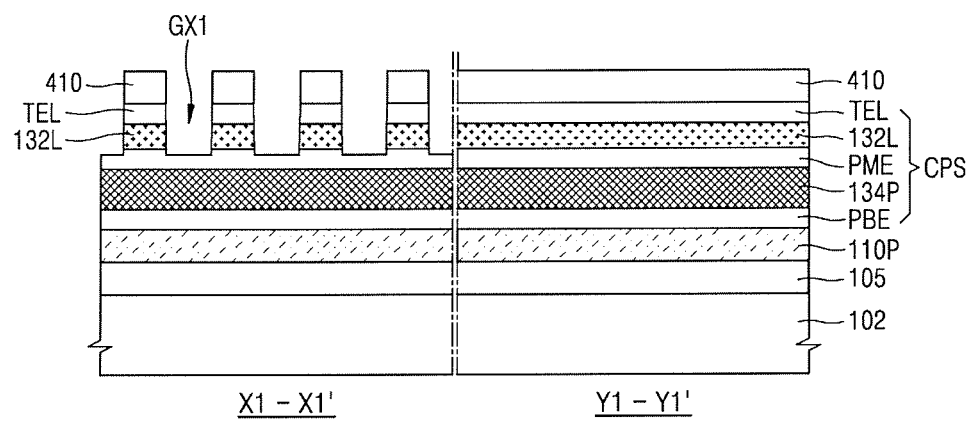
Figure 15C:
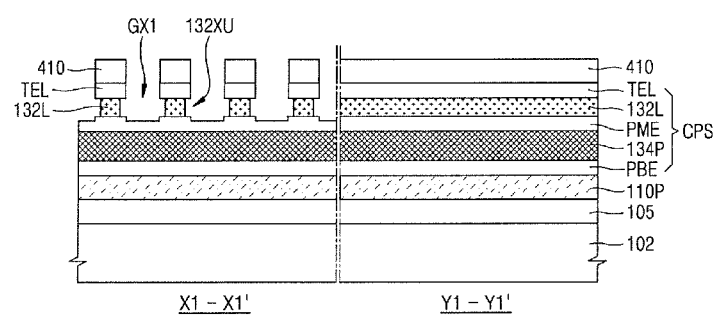
Figure 15D:
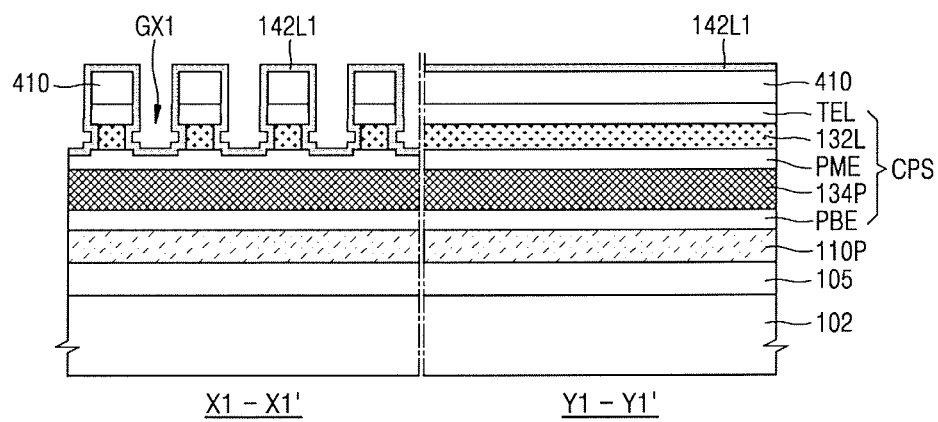
Figure 15E:
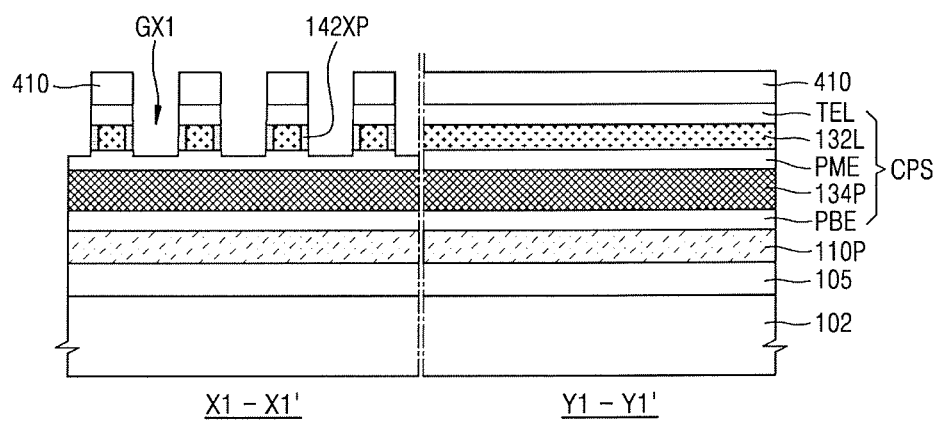
Figure 15F:
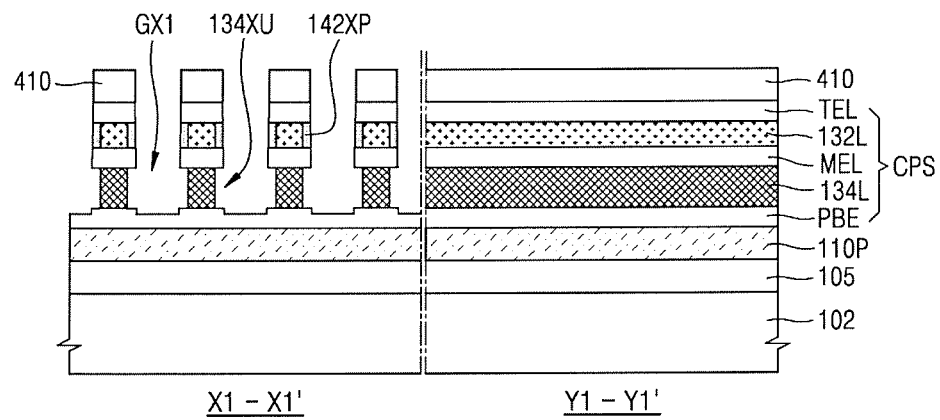
Figure 15G:
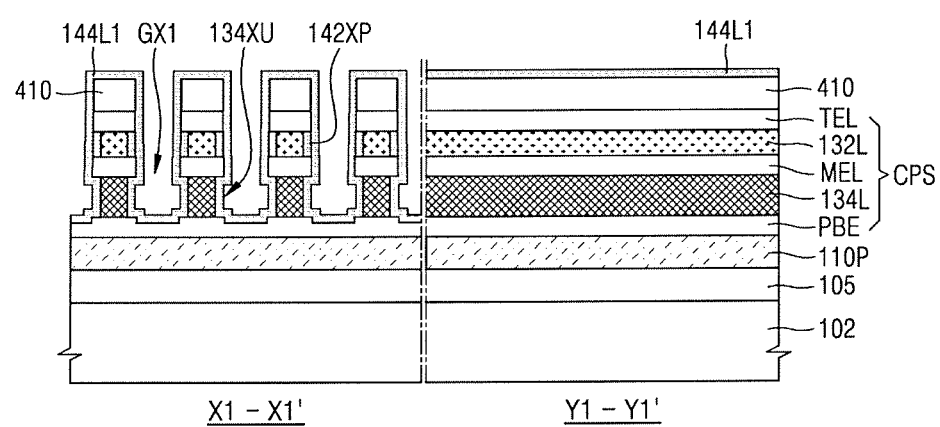
Figure 15H:
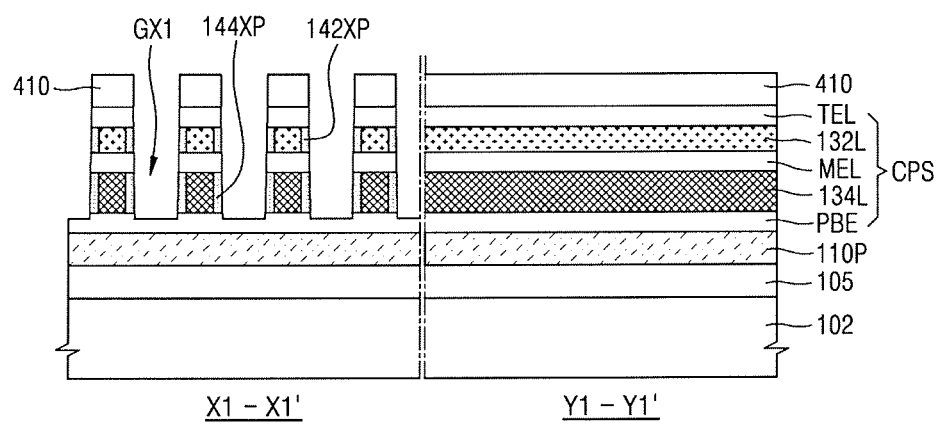
Figure 15I:
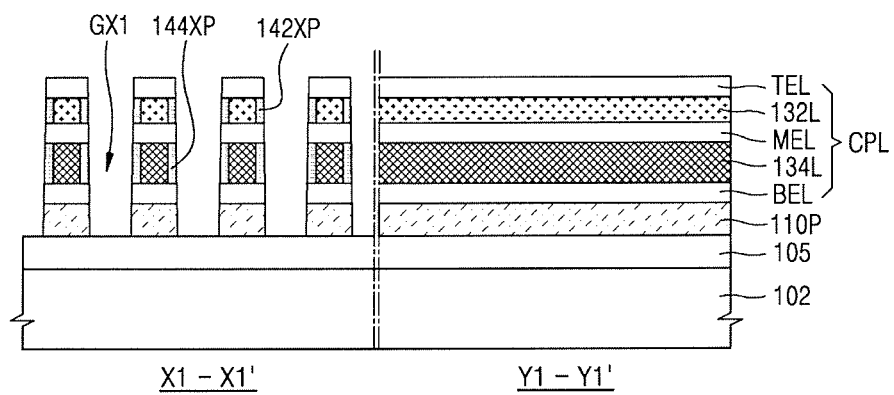
Figure 15J:
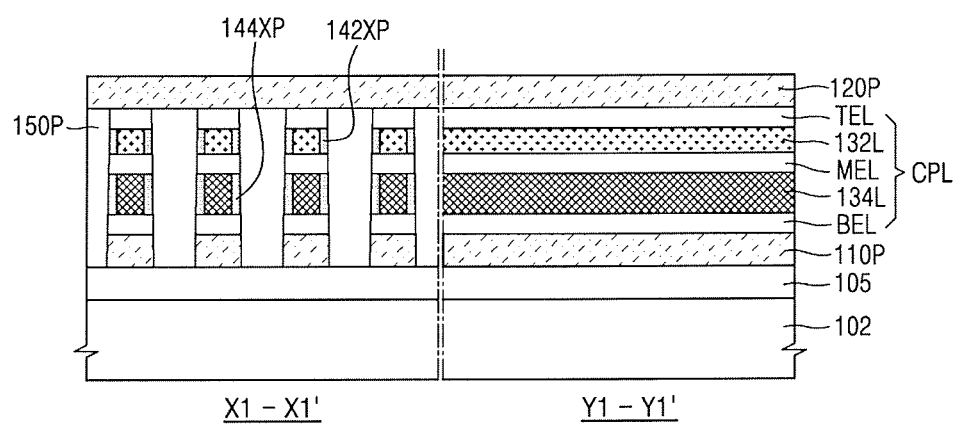
Figure 15K:
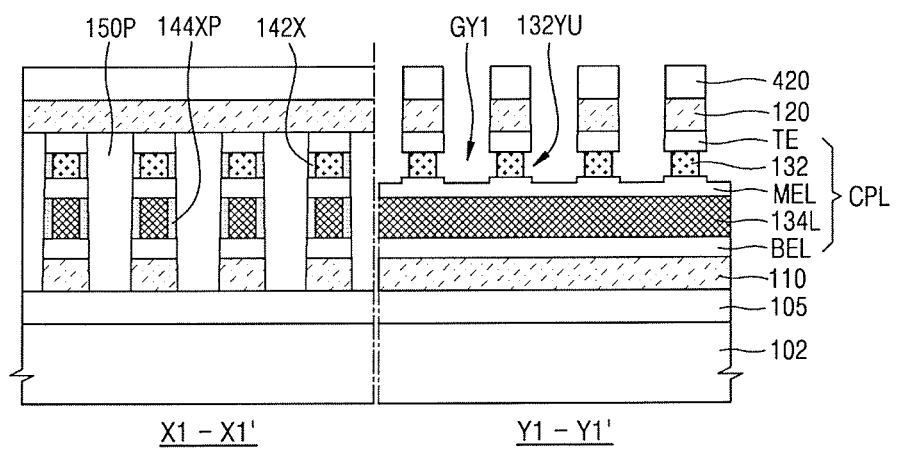
Figure 15L:
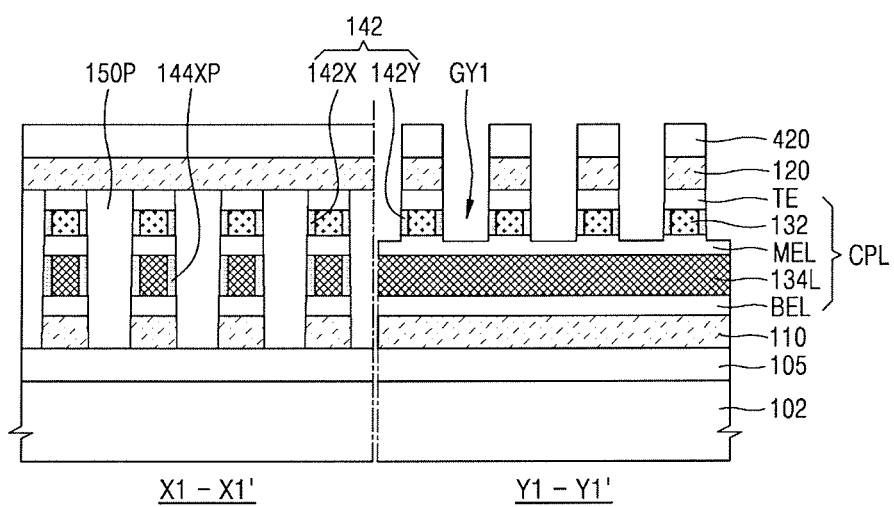
Figure 15M:
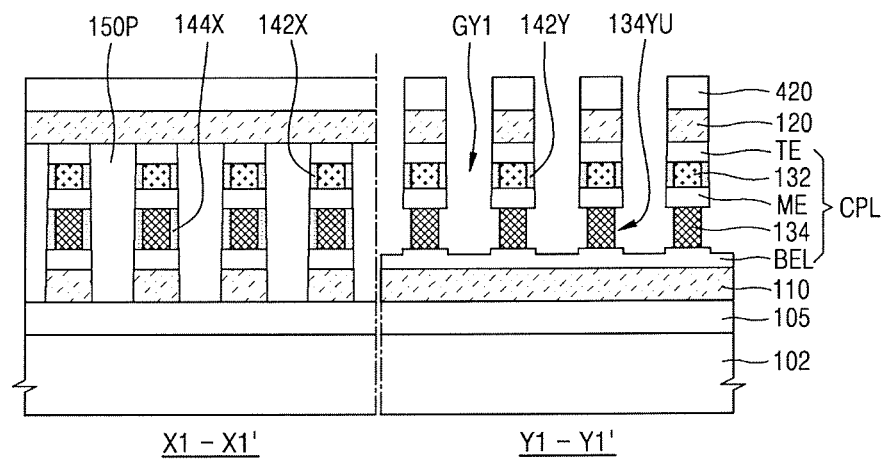
Figure 15N:
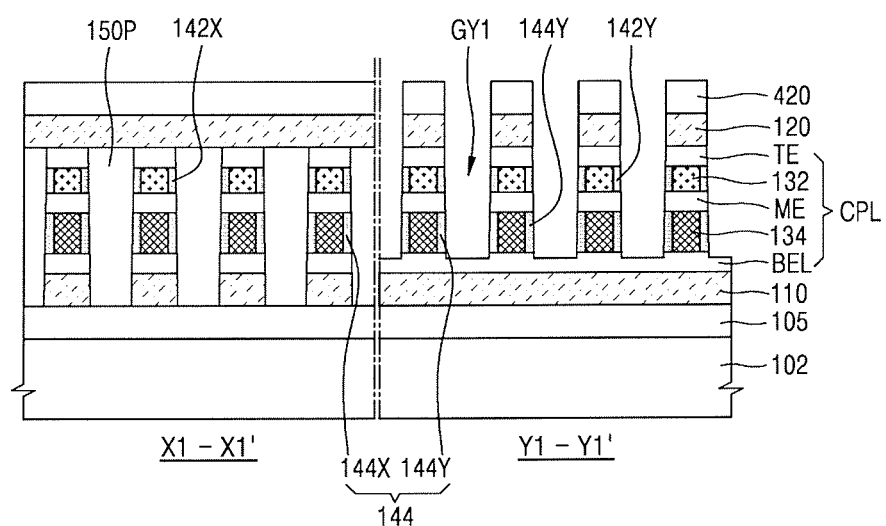
Figure 15O:
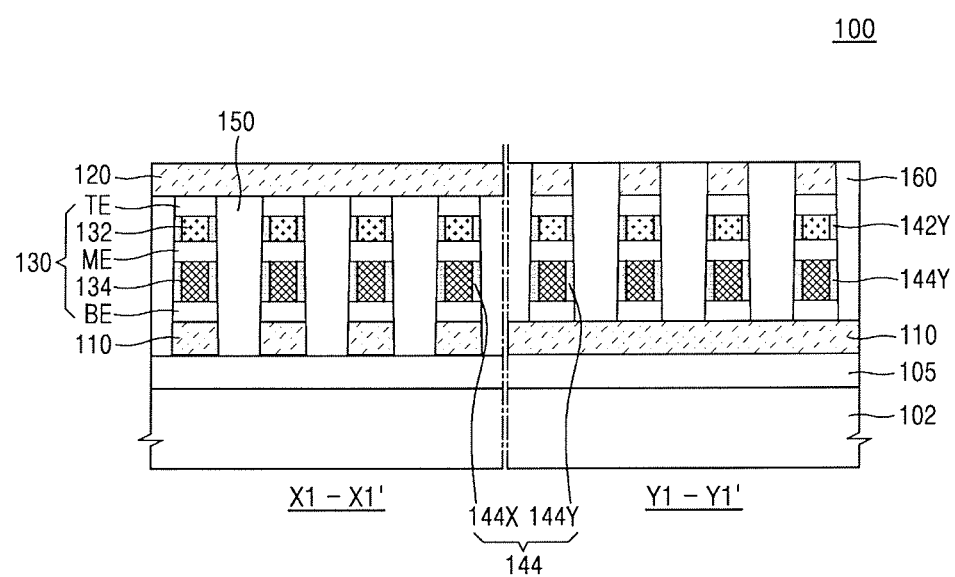

FIGS. 15A to 15O are cross-sectional views illustrating a method of manufacturing a memory device according to an exemplary embodiment of the present inventive concept.

A method of manufacturing the memory device 100 will be described in more detail below with reference to FIGS. 15A to 15O. A cross-sectional view corresponding to a cross-sectional view taken along line X1-X1' of FIG. 2 and a cross-sectional view corresponding to a cross-sectional surface taken along line Y1-Y1' of FIG. 2 will be described in more detail below with reference to 15A to 15O. Referring to FIGS. 15A to 15O, like reference numerals may refer to like components described with reference to FIGS. 1 to 14 and thus duplicative descriptions may be omitted.

Referring to FIG. 15A, the insulating interlayer 105 may be formed on the substrate 102, and a first conductive layer 110P may be formed on the insulating interlayer 105. A stacked structure CPS, in which a preliminary bottom electrode layer PBE, a preliminary selection device layer 134P, a preliminary middle electrode layer PME, a preliminary variable resistance layer 132P, and a preliminary top electrode layer PTE are sequentially stacked, for forming a cross-point array, may be formed on the first conductive layer 110P.

A first mask pattern 410 may be formed on the stacked structure CPS.

The first mask pattern 410 may include a plurality of line patterns that extend in a first direction (e.g., the X direction). The first mask pattern 410 may have a single layer or a multilayer structure in which a plurality of layers are stacked. For example, the first mask pattern 410 may include a photoresist pattern, a silicon oxide pattern, a silicon nitride pattern, a silicon oxynitride pattern, a polysilicon pattern, or a combination thereof, but exemplary embodiments of the present inventive concept are not limited thereto. In an exemplary embodiment of the present inventive concept, the first mask pattern 410 may include various materials.

Referring to FIG. 15B, by using the first mask pattern 410 as an etch mask, the preliminary top electrode PTE and the preliminary variable resistance layer 132P may be sequentially anisotropic-etched to separate the preliminary top electrode layer PTE into a plurality of top electrode lines TEL and separate the preliminary variable resistance layer 132P into a plurality of variable resistance layer lines 132L.

Thus, the plurality of top electrode lines TEL and the plurality of variable resistance layer lines 132L extending in the first direction (e.g., the X direction) may be formed, and a plurality of first gaps GX1 extending in the first direction (e.g., the X direction) may be respectively formed between the plurality of top electrode lines TEL and the plurality of variable resistance layer lines 132L.

As the plurality of first gaps GX1 are formed, a portion of a top of the preliminary middle electrode layer PME may be exposed to a bottom portion of each of the first gaps GX1. Referring to FIG. 15B, the portion of the top of the preliminary middle electrode layer PME exposed to each of the first gaps GX1 may be recessed, but exemplary embodiments of the present inventive concept are not limited thereto.

Referring to FIG. 15C, side portions of the plurality of variable resistance layer lines 132L may be removed by a predetermined width by performing an isotropic etching process on side walls of the variable resistance layer lines 132L exposed by the plurality of first gaps GX1.

The isotropic etching process may be an etching process based on an etching condition where an etching rate is sufficiently high to form the plurality of variable resistance layer lines 132L. For example, the preliminary middle electrode layer PME and the plurality of top electrode lines TEL may be etched a relatively small amount in the isotropic etching process, but may be etched at an etching rate far lower than an etching rate at which the plurality of variable resistance layer lines 132L are etched.

Since the plurality of variable resistance layer lines 132L are etched to the predetermined width while the preliminary middle electrode layer PME and the plurality of top electrode lines TEL are not etched in the isotropic etching process, a first undercut area 132XU may be formed in a portion adjacent to each of side walls of the plurality of variable resistance layer lines 132L under the plurality of top electrode lines TEL.

In an exemplary embodiment of the present inventive concept, the isotropic etching process may include a wet etching process and a dry etching process which use at least one of HBr, $Cl_2$, or $F_2$ as an etchant. For example, the isotropic etching process may be a reactive ion etching process or a reactive radical etching process, which uses an HBr gas as an etchant. For example, the isotropic etching process may be a wet etching process which uses a LAL solution as an etchant.

A profile of a side wall of each of the variable resistance layer lines 132L may be changed based on an etch rate of the isotropic etching process and/or a material of the variable resistance layer lines 132L. For example, the plurality of variable resistance layer lines 132L may each have a side wall profile which is vertically planar, or may have a rounded side wall profile. For example, according to an exemplary embodiment of the present inventive concept, when the side walls of the plurality of variable resistance layer lines 132L have a shape which is rounded and is recessed toward the insides of the plurality of variable resistance layer lines 132L, the memory device 100A may be manufactured.

Referring to FIG. 15D, a first preliminary capping layer 142L1 may be formed on the stacked structure CPS. The first preliminary capping layer 142L1 may be conformally formed on sides walls of the top electrode lines TEL and the variable resistance layer lines 132L and a top of the preliminary middle electrode layer PME, which are exposed by the plurality of first gaps GX1, in the stacked structure CPS.

In an exemplary embodiment of the present inventive concept, the first preliminary capping layer 142L1 may be include silicon nitride or silicon oxynitride. For example, the first preliminary capping layer 142L1 may be formed by a chemical vapor deposition (CVD) process, an atomic layer deposition (ALD) process, or a plasma enhanced CVD (PECVD) process. The first preliminary capping layer 142L1 may be formed to a thickness of from about 2 nm to about 50 nm.

In an exemplary embodiment of the present inventive concept, the first preliminary capping layer 142L1 may fill the first undercut area 132XU. However, exemplary embodiments of the present inventive concept are not limited thereto.

Referring to FIG. 15E, a plurality of first capping lines 142XP may be formed on side walls of the variable resistance layer lines 132L by etching back the first preliminary capping layer 142L1 in the plurality of first gaps GX1 until the top of the preliminary middle electrode layer PME is exposed.

Only a portion of the first preliminary capping layer 142L1 filled into the first undercut area 132XU may remain while a portion of the first preliminary capping layer 142L1 disposed in each of the first gaps GX1 is being removed in the etchback process, and thus, the plurality of first capping lines 142XP may be formed. Side walls of the first capping lines 142XP may contact the side walls of the variable resistance layer lines 132L, and tops and bottoms of the first capping lines 142XP may contact bottoms of the top electrode lines TEL and tops of a plurality of middle electrode lines MEL.

A portion of the first preliminary capping layer 142L1 disposed on the first mask pattern 410 may be removed by the etchback process, and the top of the first mask pattern 410 may be exposed. The plurality of first capping lines 142XP may extend along the first direction (e.g., the X direction) both side walls of each of the variable resistance layer lines 132L.

Referring to FIG. 15F, by using the first mask pattern 410 as an etch mask, the preliminary middle electrode layer PME and the preliminary selection device layer 134P may be sequentially anisotropic-etched to separate the preliminary middle electrode layer PME into a plurality of middle electrode lines MEL and separate the preliminary selection device layer 134P into a plurality of selection device layer lines 134L.

Thus, the plurality of middle electrode lines MEL and the plurality of selection device layer lines 134L extending in the first direction (e.g., the X direction) may be formed, and a bottom portion of each of the first gaps GX1 may extend to between the plurality of middle electrode lines MEL and the plurality of selection device layer lines 134L.

In the anisotropic etching process of forming the plurality of middle electrode lines MEL and the plurality of selection device layer lines 134L, the side walls of the variable resistance layer lines 132L may be covered by the plurality of first capping lines 142XP and thus the side walls need not be exposed. Since the side walls of the variable resistance layer lines 132L are not exposed to the etching atmosphere, an occurrence of damage to the variable resistance layer lines 132L during the etching process may be reduced or prevented.

Side portions of the selection device layer lines 134L may be removed by a predetermined width by performing an isotropic etching process on side walls of the selection device layer lines 134L exposed by the plurality of first gaps GX1.

The isotropic etching process may be an etching process based on an etching condition where an etching rate is sufficiently high for the plurality of selection device layer lines 134L. For example, the preliminary bottom electrode layer PBE, the plurality of top electrode lines TEL, and the plurality of middle electrode lines MEL may be etched in the isotropic etching process, but may be etched at an etching rate far lower than an etching rate at which the plurality of selection device layer lines 134L are etched.

Since the plurality of selection device layer lines 134L are etched to the predetermined width while the preliminary bottom electrode layer PBE and the plurality of middle electrode lines MEL are not etched in the isotropic etching process, a second undercut area 134XU may be formed in a portion adjacent to each of side walls of the selection device layer lines 134L under the plurality of middle electrode lines MEL.

In the isotropic etching process, the side walls of the variable resistance layer lines 132L may be covered by the plurality of first capping lines 142XP and thus the side walls need not be exposed to the plurality of first gaps GX1. Since the side walls of the variable resistance layer lines 132L are not exposed to the etching atmosphere, an occurrence of damage to the variable resistance layer lines 132L in the etching process may be reduced or prevented.

The isotropic etching process for the variable resistance layer lines 132L may be similar to the isotropic etching process, described in more detail above with reference to FIG. 15C.

Referring to FIG. 15G, a second preliminary capping layer 144L1 may be formed on the stacked structure CPS. The second preliminary capping layer 144L1 may be conformally formed on sides walls of the top electrode lines TEL, the first capping lines 142XP, the middle electrode lines MEL, and the selection device layer lines 134L and a top of the preliminary middle electrode layer PME, which are exposed by the plurality of first gaps GX1, in the stacked structure CPS.

In an exemplary embodiment of the present inventive concept, the second preliminary capping layer 144L1 may include silicon nitride or silicon oxynitride and may be formed by a CVD process, an ALD process, or a PECVD process. The second preliminary capping layer 144L1 may be formed to a thickness of from about 2 nm to about 50 nm. However, exemplary embodiments of the present inventive concept are not limited thereto.

In an exemplary embodiment of the present inventive concept, the second preliminary capping layer 144L1 may fill the second undercut area 134XU. However, exemplary embodiments of the present inventive concept are not limited thereto.

Referring to FIG. 15H, a plurality of second capping lines 144XP may be formed on side walls of the selection device layer lines 134L by etching back the second preliminary capping layer 144L1 in the plurality of first gaps GX1 until the top of the preliminary bottom electrode layer PBE is again exposed.

Only a portion of the second preliminary capping layer 144L1 filled into the second undercut area 134XU may remain while a portion of the second preliminary capping layer 144L1 disposed in each of the first gaps GX1 are being removed in the etchback process, and thus, the plurality of second capping lines 144XP may be formed.

A portion of the second preliminary capping layer 144L1 disposed on the first mask pattern 410 may be removed by the etchback process, and the top of the first mask pattern 410 may be exposed. The plurality of second capping lines 144XP may extend along the first direction (e.g., the X direction) on side walls of each of the selection device layer lines 134L.

Referring to FIG. 15I, by using the first mask pattern 410 as an etch mask, the preliminary bottom electrode layer PBE and the first conductive layer 110P may be sequentially anisotropic-etched to separate the preliminary bottom electrode layer PBE into a plurality of bottom electrode lines BEL and separate the first conductive layer 110P into a plurality of word lines 110.

The side walls of the variable resistance layer lines 132L may be covered by the first capping lines 142XP, and the side walls of the selection device layer lines 134L may be covered by the second capping lines 144XP. Thus, the variable resistance layer lines 132L and the selection device layer lines 134L may be prevented from being exposed to the etching atmosphere and damage to the variable resistance layer lines 132L and the selection device layer lines 134L due to the exposure may be prevented.

In the anisotropic etching process of forming the plurality of bottom electrode lines BEL and the plurality of word lines 110, a plurality of stacked lines CPL which are spaced apart from each other by the plurality of first gaps GX1 and extend in the first direction (e.g., the X direction) may be formed on the substrate 102.

Subsequently, the first mask pattern 410 may be removed.

Referring to FIG. 15J, a first insulation layer 150P filling each of the first gaps GX1 may be formed. For example, the first insulation layer 150P may be formed on the plurality of stacked lines CPL and the insulating interlayer 105 by filling the plurality of first gaps GX1 with an insulating material and planarizing a top of the insulation material until tops of the stacked lines CPL are exposed.

In an exemplary embodiment of the present inventive concept, the first insulation layer 150P may include a material which is lower in dielectric constant than the first and second capping lines 142L and 144L. For example, the first insulation layer 150P may include silicon oxide such as BPSG, PSG, USG, FSG, SOG, FOX, TEOS, PE-TEOS, HDP-CVD oxide, FSG, SiOC, or the like. The first insulation layer 150P may include one kind of insulation layer or a plurality of insulation layers. However, exemplary embodiments of the present inventive concept are not limited thereto.

In an exemplary embodiment of the present inventive concept, the air spacer AS may be formed in the first insulation layer 150P. Thus, the memory device 100D may be manufactured.

When the air spacer AS is formed in the first insulation layer 150P, the first insulation layer 150P may include silicon oxide. According to an exemplary embodiment of the present inventive concept, since the plurality of first gaps GX1 are not fully filled in a process of forming the first insulation layer 150P, the air spacer AS may be formed in the first insulation layer 150P. According to another exemplary embodiment of the present inventive concept, the first insulation layer 150P which has a relatively thin thickness and conformally covers inner walls of the first gaps GX1 may be formed and a sacrificial layer which fills the insides of the first gaps GX1 on the first insulation layer 150P may be formed, and then, the air spacer AS may be formed in the first insulation layer 150P by selectively removing the sacrificial layer through an ashing process and/or a strip process.

A second conductive layer 120P may be formed on the first insulation layer 150P and the plurality of stacked lines CPL. The second conductive layer 120P may be similar to the first conductive layer 110P.

Referring to FIG. 15K, a second mask pattern 420 may be formed on the second conductive layer 120P. The second mask pattern 420 may include a plurality of line patterns that extend in a second direction (e.g., a Y direction). The second mask pattern 420 may have a single layer structure or a multilayer structure in which a plurality of layers is stacked.

By using the second mask pattern 420 as an etch mask, the second conductive layer 120P, the plurality of top electrode lines TEL, and the plurality of variable resistance layer lines 132L may be sequentially anisotropic-etched to separate the second conductive layer 120P into a plurality of bit lines 10, separate each of the top electrode lines TEL into a plurality of top electrodes TE, and separate each of the variable resistance layer lines 132L into a plurality of variable resistance layers 132.

A plurality of second gaps GY1 extending along the second direction (e.g., the Y direction) may be formed by the anisotropic process. The plurality of top electrodes TE and the plurality of variable resistance layers 132 may be spaced apart from each other along the first direction and the second direction. Each of the first capping lines 142XP disposed on the side walls of the variable resistance layers 132 may be separated into first portions 142X of the first capping layers 142.

Side portions of the variable resistance layers 132 may be removed by a predetermined width by performing an isotropic etching process on side walls of the variable resistance layers 132 exposed by the plurality of second gaps GY1. Thus, a third undercut area 132YU may be formed in a portion adjacent to each of the side walls of the variable resistance layers 132 under the plurality of top electrodes TE. The first portions 142X of the first capping layers 142 need not be removed in the isotropic etching process.

Referring to FIG. 15L, a third preliminary capping layer may be conformally formed on the stacked structure CPS, and the second portion 142Y of the first capping layer 142 may be formed on the side wall of each of the variable resistance layers 132 by etching back the third preliminary capping layer in each of the second gaps GY1 until the tops of the middle electrode lines MEL are exposed.

The second portion 142Y of the first capping layer 142 may cover the side wall of each of the variable resistance layers 132 exposed by the plurality of second gaps GY1. The second portion 142Y of the first capping layer 142 together with the first portion 142X may surround the side wall of each of the variable resistance layers 132.

Referring to FIG. 15M, by using the second mask pattern 420 as an etch mask, the plurality of middle electrode lines MEL and the plurality of selection device layer lines 134L may be sequentially anisotropic-etched to separate each of the middle electrode lines MEL into a plurality of middle electrodes ME and separate each of the selection device layer lines 134L into a plurality of selection devices 134.

The plurality of middle electrodes ME and the plurality of selection devices 134 may be spaced apart from each other along the first direction and the second direction. Each of the second capping lines 144XP disposed on the side walls of the selection devices 134 may be separated into third portions 144X of a plurality of second capping layers 144.

The side walls of the selection devices 134 may be removed by a predetermined width by performing an isotropic etching process on the side walls of the selection devices 134 exposed by the plurality of second gaps GY1. A fourth undercut area 134YU may be formed in a portion adjacent to each of the side walls of the selection devices 134 under the plurality of middle electrodes ME.

Referring to FIG. 15N, a fourth preliminary capping layer may be conformally formed on the stacked structure CPS, and the fourth portion 144Y of the second capping layer 144 may be formed on the side wall of each of the selection devices 134 by etching back the fourth preliminary capping layer in each of the second gaps GY1 until the tops of the bottom electrode lines BEL are exposed.

The fourth portion 144Y of the second capping layer 144 may cover the side wall of each of the selection devices 134 exposed by the plurality of second gaps GY1. The fourth portion 144Y of the second capping layer 144 together with the third portion 144X may surround the side wall of each of the selection devices 134.

Referring to FIG. 15O, by using the second mask pattern 420 as an etch mask, the plurality of bottom electrode lines BEL may be anisotropically etched to separate each of the bottom electrode lines BEL into a plurality of bottom electrodes BE. Each of the stacked lines CPL may be separated into a plurality of memory pillars 130, which are spaced apart from each other in the first direction and the second direction, by the anisotropic etching process. The first insulation layer 150P may be separated into a plurality of first insulation patterns 150, which are spaced apart from each other in the first direction and the second direction between the plurality of memory cell pillars 130, by the anisotropic etching process.

A plurality of second insulation patterns 160 filling the plurality of second gaps GY1 may be formed on the plurality of bit lines 120, the plurality of memory cell pillars 130, and the plurality of first insulation patterns 150 by filling the plurality of second gaps GY1 with an insulating material and planarizing a top of the insulation material. The plurality of second insulation patterns 160 may extend along the second direction (e.g., the Y direction).

In an exemplary embodiment of the present inventive concept, the plurality of second insulation patterns 160 may each include a material which is lower in dielectric constant than the first and second capping layers 142 and 144. For example, the plurality of second insulation patterns 160 may each include a silicon oxide, such as, BPSG, PSG, USG, FSG, SOG, FOX, TEOS, PE-TEOS, HDP-CVD oxide, FSG, or SiOC.

According to an exemplary embodiment of the present inventive concept, in a process of forming the plurality of memory cell pillars 130 (for example, a process of etching the plurality of memory cell pillars 130, a process of etching the word lines 110 or the bit lines 120, or a process of forming the plurality of insulation patterns 150 and 160), when the variable resistance layer 132 including the phase material layer and the selection device 134 including the material having the OTS characteristic are exposed to an atmosphere (e.g., air) of the process for example, the variable resistance layer 132 and the selection device 134 may be damaged. A passivation layer including silicon nitride may surround a side wall of each of the plurality of memory cell pillars 130, and thus damage to the cell pillars 130 may be reduced or prevented. However, in a memory device including a cross-point structure, as a width of each of the memory cell pillars 130 is reduced, an interval between the memory cell pillars 130 is also reduced. Thus, the passivation layer may substantially fully fill the interval between the memory cell pillars 130, and a parasitic capacitance increases due to the passivation layer which has a high dielectric constant generally, may cause a relatively large RC delay in driving the memory device.

In the method of manufacturing the memory device 100 according to an exemplary embodiment of the present inventive concept, the capping layers 142 and 144 having a relatively thin thickness may be disposed on only the side walls of the variable resistance layer 132 and the selection device 134 by the isotropic etching process, and the plurality of insulation patterns 150 and 160 may be disposed between the memory cell pillars 130. The plurality of insulation patterns 150 and 160 may include a material having a dielectric constant which is lower than that of each of the capping layers 142 and 144. Thus, RC delay which may occur in driving the memory device 100 may be reduced or eliminated, thus enabling the memory device 100 to operate at a relatively high speed.

In the method of manufacturing the memory device 100 according to an exemplary embodiment of the present inventive concept, since the first and second capping layers 142 and 144 may be disposed on only the side walls of the variable resistance layers 132 and the selection devices 134, the variable resistance layers 132 and the selection devices 134 may be prevented from being exposed or damaged in a process of the bottom layer or a process of manufacturing the plurality of insulation patterns 150 and 160. Thus, the memory device 100 manufactured by the manufacturing method may have increased reliability.

FIGS. 16A to 16G are cross-sectional views illustrating a method of manufacturing a memory device according to an exemplary embodiment of the present inventive concept. Referring to FIGS. 16A to 16G, like reference numerals may refer to like components described with reference to FIGS. 15A to 15O and thus duplicative descriptions may be omitted.

Figure 16A:
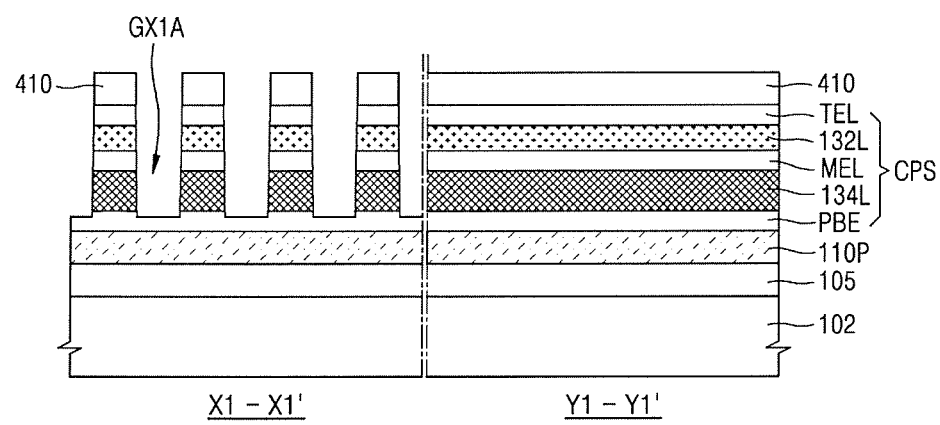
FIGS. 16A to 16G are cross-sectional views illustrating a method of manufacturing a memory device according to an exemplary embodiment of the present inventive concept.

Referring to FIG. 16A, the first mask pattern 410 may be formed on the stacked structure CPS. The stacked structure CPS may be anisotropic-etched by using the first mask pattern 410 as an etch mask to respectively separate the preliminary top electrode layer PTE, the preliminary variable resistance layer 132P, the preliminary middle electrode layer PME, and the preliminary selection device layer 134P into a plurality of top electrode lines TEL, a plurality of variable resistance layer lines 132L, a plurality of middle electrode lines MEL, and a plurality of selection device layer lines 134L, respectively.

Thus, a plurality of first gaps GX1A extending in a first direction (e.g., the X direction) may be respectively formed between the plurality of top electrode lines TEL, the plurality of variable resistance layer lines 132L, the plurality of middle electrode lines MEL, and the plurality of selection device layer lines 134L extending in the first direction (e.g., the X direction).

Figure 16B:
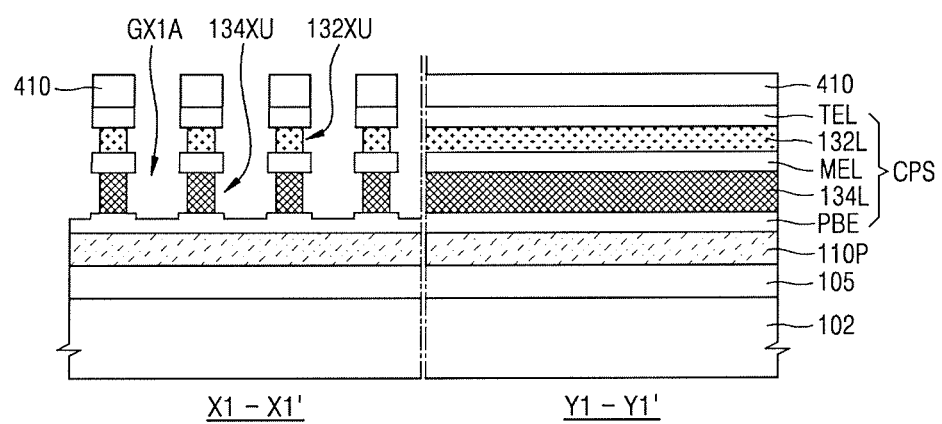

Referring to FIG. 16B, side portions of the variable resistance layer lines 132L and side portions of the selection device layer lines 134L may be removed by a predetermined width by performing an isotropic etching process on side walls of the variable resistance layer lines 132L and side walls of the selection device layer lines 134L exposed by the plurality of first gaps GX1A.

In the isotropic etching process, the plurality of variable resistance layer lines 132L and the plurality of selection device layer lines 134L may be etched by the predetermined width while the plurality of top electrode lines TEL and the plurality of middle electrode lines MEL are not etched. Thus, a first undercut area 132XU may be formed in a portion adjacent to each of side walls of the variable resistance layer lines 132L under the plurality of top electrode lines TEL, and a second undercut area 134XU may be formed in a portion adjacent to each of side walls of the selection device layer lines 134L under the plurality of middle electrode lines MEL.

A width of the first undercut area 132XU and a width of the second undercut area 134XU may be changed based on the isotropic etching process conditions and/or a material of each of the variable resistance layer lines 132L and the selection device layer lines 134L.

In an exemplary embodiment of the present inventive concept, in the isotropic etching process, an etching rate at which the plurality of variable resistance layer lines 132L are etched may be similar to an etching rate at which the plurality of selection device layer lines 134L are etched. For example, when the plurality of variable resistance layer lines 132L and the plurality of selection device layer lines 134L each include a chalcogenide material, the plurality of variable resistance layer lines 132L and the plurality of selection device layer lines 134L may be etched at similar etching rates in the isotropic etching process. In the isotropic etching process, an amount by which side portions of the variable resistance layer lines 132L are removed may be similar to an amount by which side portions of the selection device layer lines 134L are removed, and the width of the first undercut area 132XU may be similar to the width of the second undercut area 134XU. Thus, the memory device 100 may be manufactured.

In an exemplary embodiment of the present inventive concept, the isotropic etching process may use an etching condition where an etching rate at which the plurality of variable resistance layer lines 132L are etched may differ from an etching rate at which the plurality of selection device layer lines 134L are etched. Thus, the width of the first undercut area 132XU may differ from the width of the second undercut area 134XU. Thus, the memory device 100B may be manufactured.

Figure 16C:
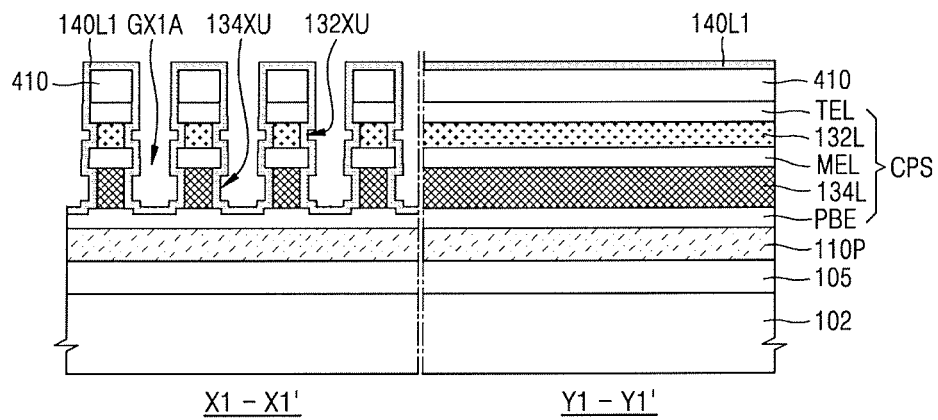

Referring to FIG. 16C, a fifth preliminary capping layer 140L1 may be conformally formed on the plurality of top electrode lines TEL, the plurality of variable resistance layer lines 132L, the plurality of middle electrode lines MEL, the plurality of selection device layer lines 134L, and a preliminary bottom electrode layer PBE. The fifth preliminary capping layer 140L1 may fill the first undercut area 132XU and the second undercut area 134XU.

Figure 16D:
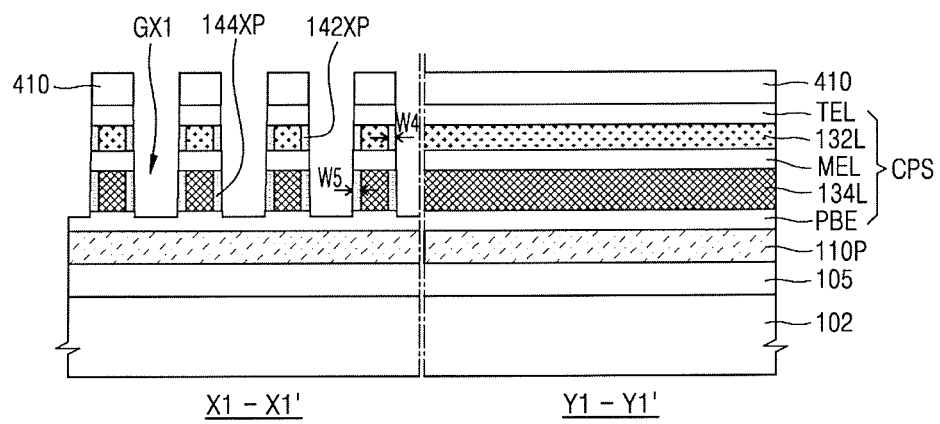

Referring to FIG. 16D, by etching back the fifth preliminary capping layer 140L1 in each of the first gaps GX1A until a top of the preliminary bottom electrode layer PBE is exposed, a plurality of first capping lines 142XP may be formed on side walls of the variable resistance layer lines 132L, and a plurality of second capping lines 144XP may be formed on side walls of the selection device layer lines 134L.

When the width of the first undercut area 132XU is substantially the same as that of the second undercut area 134XU, a fourth width W4 of each of the first capping lines 142XP may be substantially the same as a fifth width W5 of each of the second capping lines 144XP. However, exemplary embodiments of the present inventive concept are not limited thereto. According to an exemplary embodiment of the present inventive concept, the fourth width W4 of each of the first capping lines 142XP may be different from the fifth width W5 of each of the second capping lines 144XP.

Subsequently, the processes described above with reference to FIGS. 15I and 15J may be performed.

Figure 16E:
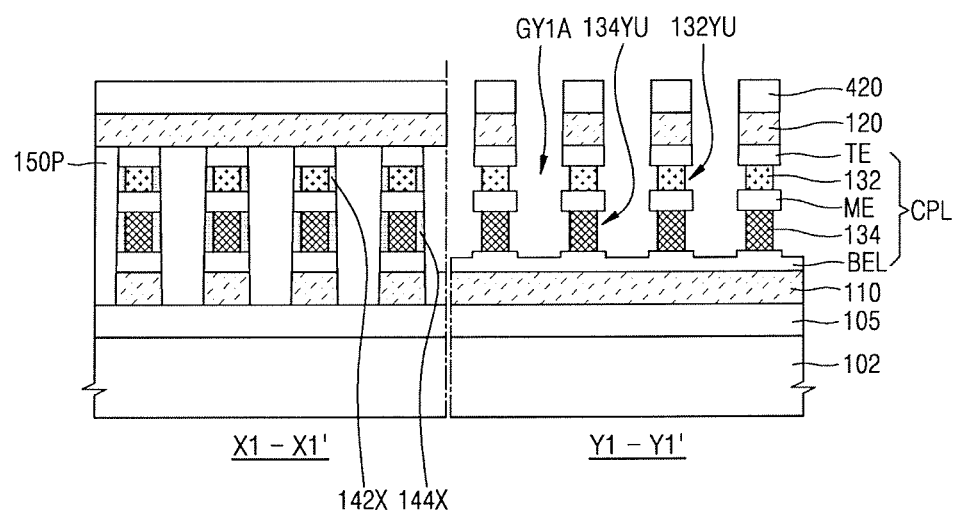

Referring to FIG. 16E, the second mask pattern 420 including a plurality of line patterns which extend in parallel along a second direction (e.g., the Y direction) may be formed on a second conductive layer 120P.

A process similar to the processes described above with reference to FIGS. 16A to 16D may be performed. A plurality of second gaps GY1A may be formed by anisotropic-etching the stacked structure CPS, and an isotropic etching process of removing side portions of a plurality of variable resistance layers 132 and side portions of a plurality of selection devices 134 may be performed. Thus, a plurality of bit lines 120 may be formed.

Figure 16F:
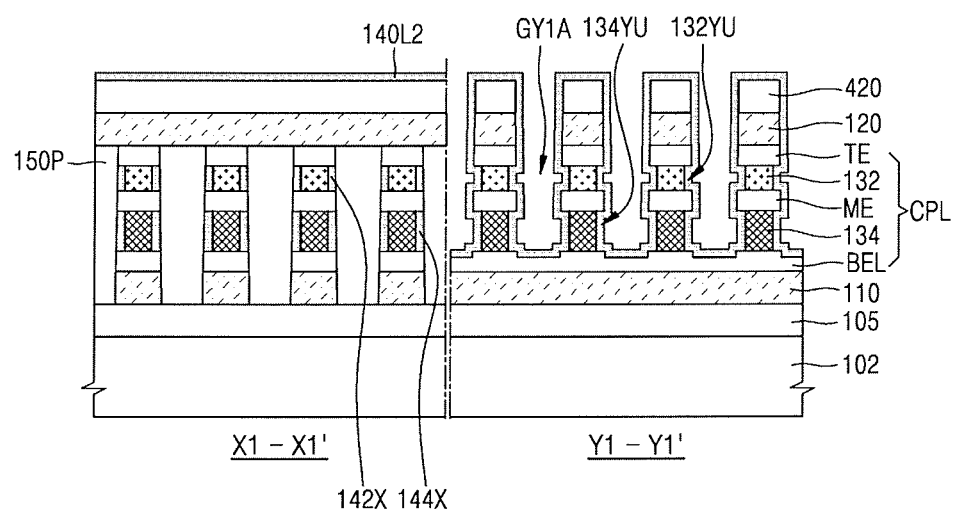

Referring to FIG. 16F, a sixth preliminary capping layer 140L2 may be conformally formed on a top and a side wall of each of a plurality of stacked lines CPL and may fill a third undercut area 132YU and a fourth undercut area 134YU.

Figure 16G:
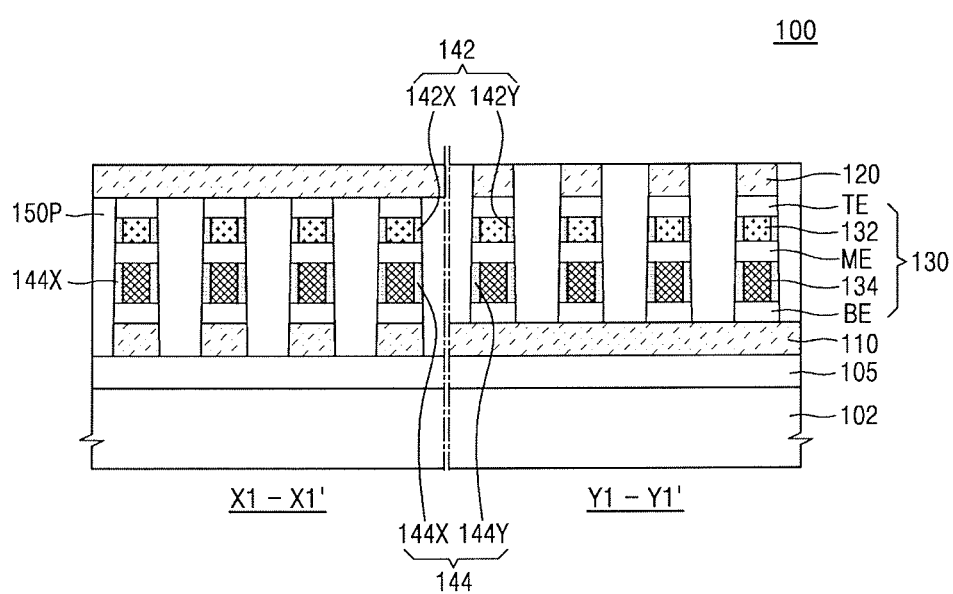

Referring to FIG. 16G, etching back of the sixth preliminary capping layer 140L2 in the second gaps GY1A until a top of a bottom electrode layer BEL is exposed may be performed. A plurality of first capping layers 142 may be formed on side walls of the variable resistance layers 132, and a plurality of second capping layers 144 may be formed on side walls of the selection devices 134.

Subsequently, the processes described above with reference to FIG. 15O may be performed.

In the method of manufacturing the memory device 100 according to an exemplary embodiment of the present inventive concept, a number of times an etching process and a process of forming the capping layers 142 and 144 are performed may be reduced, and thus, the memory device 100 including the capping layers 142 and 144 may be manufactured by a simpler process.

FIGS. 17A to 17D are cross-sectional views illustrating a method of manufacturing a memory device according to an exemplary embodiment of the present inventive concept. Referring to FIGS. 17A to 17D, like reference numerals may refer to like components described with reference to FIGS. 1 to 16G and thus duplicative descriptions may be omitted.

First, the process described above with reference to FIGS. 15A to 15C may be performed.

Figure 17A:
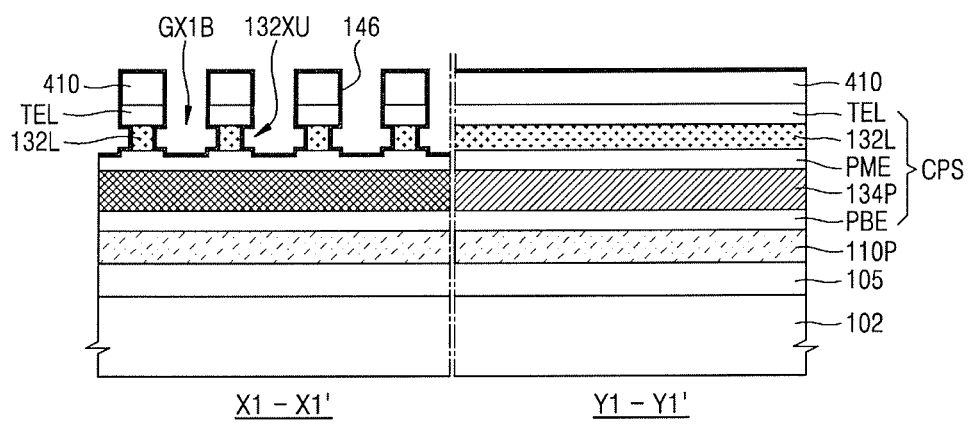
FIGS. 17A to 17D are cross-sectional views illustrating a method of manufacturing a memory device according to an exemplary embodiment of the present inventive concept.

Referring to FIG. 17A, the insulation liner 146 may be conformally formed on an inner wall of each of a plurality of first gaps GX1B. The insulation liner 146 may be conformally formed on a bottom of each of a plurality of top electrode lines TEL and a side wall of each of a plurality of variable resistance layer lines 132L in a first undercut area 132XU. The insulation liner 146 may include silicon oxynitride or silicon nitride and may be formed to have a thickness of from about 2 nm to about 50 nm through a CVD process, an ALD process, or a PECVD process.

Figure 17B:
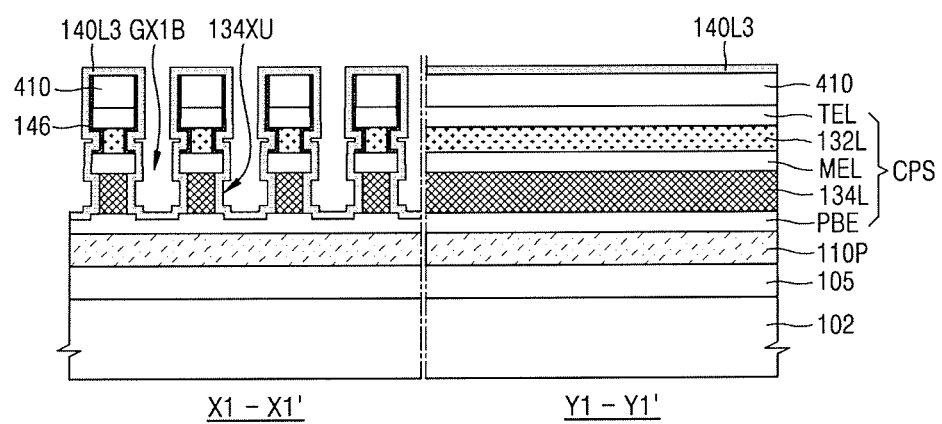

Referring to FIG. 17B, a top of the preliminary bottom electrode layer PBE may be exposed by performing the anisotropic etching process and the isotropic etching process described above with reference to FIG. 15F.

According to an exemplary embodiment of the present inventive concept, in the etching process, a portion of the insulation liner 146 which is disposed on a top of a first mask pattern 410 and a top of the preliminary middle electrode layer PME may be removed, and a portion of the insulation liner 146 which is disposed on a side wall of each of the top electrode lines TEL and in the first undercut area 132XU may remain. However, exemplary embodiments of the present inventive concept are not limited thereto.

A seventh preliminary capping layer 140L3 may be conformally formed on the inner wall of each of the first gaps GX1B.

Figure 17C:
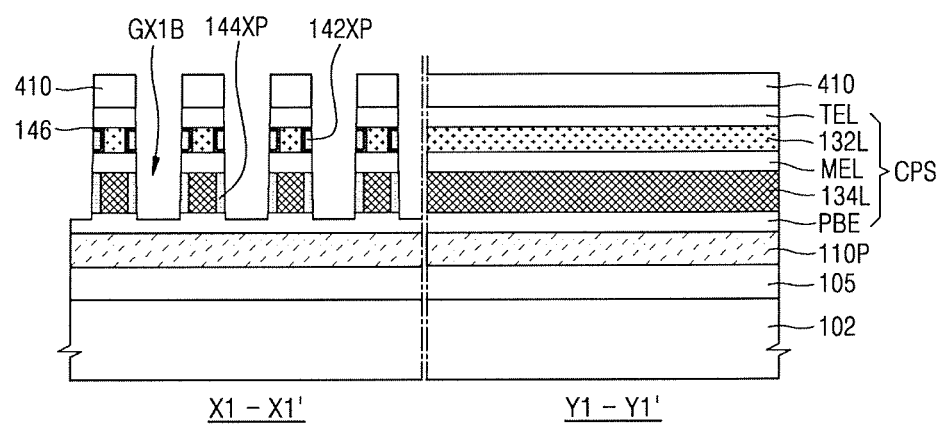

Referring to FIG. 17C, by etching back the seventh preliminary capping layer 140L3 in each of the first gaps GX1B until the top of the preliminary bottom electrode layer PBE is again exposed, a plurality of first capping lines 142XP may be formed on side walls of the variable resistance layer lines 132L, and a plurality of second capping lines 144XP may be formed on side walls of a plurality of selection device layer lines 134L.

Figure 17D:
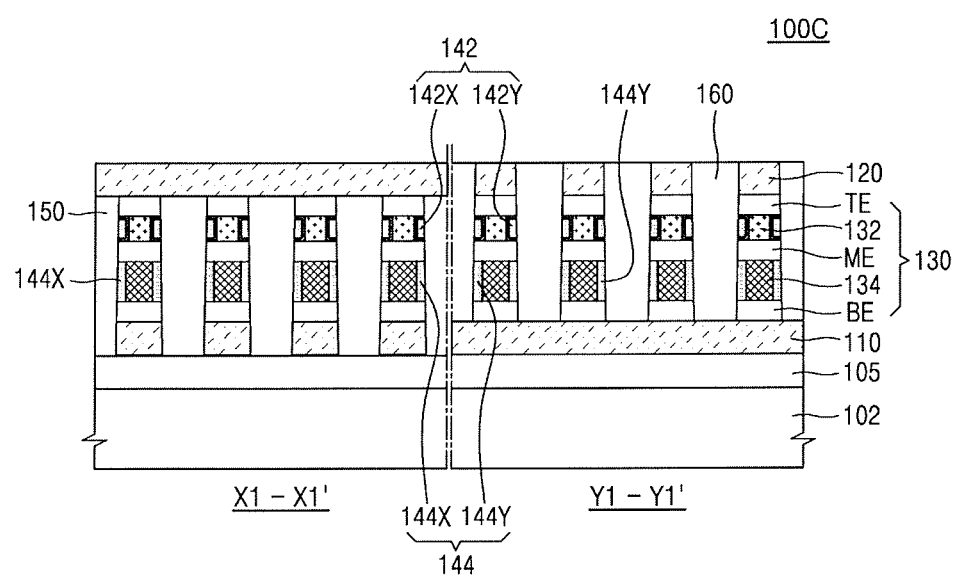

Referring to FIG. 17D, the second mask pattern 420 including a plurality of line patterns which extend along a second direction (e.g., the Y direction) may be formed on the stacked structure CPS. Subsequently, the plurality of second gaps GY1A may be formed by anisotropically etching the stacked structure CPS with the second mask pattern 420 as an etch mask.

The insulation liner 146 may be formed by performing processes similar to the processes described above with reference to FIGS. 17A to 17C, and a process similar to the processes described above with reference to FIGS. 16A to 16D may be performed. Thus, the memory device 100c may be manufactured.

While the present inventive concept has been particularly shown and described with reference to exemplary embodiments thereof, it will be understood that various changes in form and details may be made therein without departing from the spirit and scope of the present inventive concept.

What is claimed is:

1. A memory device comprising:
    a plurality of first word lines extending in a first direction parallel to a top of a substrate;
    a plurality of bit lines extending in a second direction, the second direction being different from the first direction;
    a plurality of memory units respectively arranged at cross points between the plurality of bit lines and the plurality of first word lines, each of the plurality of memory units including a selection device, a middle electrode, and a variable resistance layer; and
    a first capping layer disposed on a side wall of a recessed portion of each of the variable resistance layers and a second capping layer disposed on a side wall of a recessed portion of each of the selection devices, wherein the second capping layer is spaced apart from the first capping layer.

2. The memory device of claim 1, wherein a first width of the middle electrode in a first direction is greater than a second width of the variable resistance layer in the first direction or a third width of the selection device in the first direction.

3. The memory device of claim 1, wherein a side wall of the middle electrode is substantially aligned with a side wall of the first capping layer or a side wall of the second capping layer.

4. The memory device of claim 1, further comprising:
    an insulation pattern between two adjacent memory units among the plurality of memory units, the insulation pattern including a material having a dielectric constant less than a dielectric constant of the plurality of capping layers.

5. The memory device of claim 4, wherein the insulation pattern is on a side wall of each of the plurality of capping layers and does not contact the variable resistance layer or the selection device.

6. The memory device of claim 1, wherein
    the selection device has ovonic threshold switching (OTS) characteristic, and
    the selection device comprises at least two of silicon (Si), germanium (Ge), antimony (Sb), tellurium (Te), selenium (Se), indium (In), or tin (Sn), based on arsenic (As), or
    the selection device comprises at least two of silicon (Si), germanium (Ge), antimony (Sb), tellurium (Te), arsenic (As), indium (In), or tin (Sn), based on selenium (Se).

7. The memory device of claim 1, further comprising:
    a driving circuit area between the top of the substrate and a bottom of each of the plurality of first word lines or between the top of the substrate and a bottom of each of the plurality of bit lines, the driving circuit area including a plurality of driving circuits configured to drive the plurality of memory units.

8. The memory device of claim 1, further comprising an insulation liner between the first capping layer and the variable resistance layer.

9. A memory device, comprising:
    a substrate;
    an insulating interlayer disposed on the substrate;
    a word line disposed on the insulation interlayer;
    a bottom electrode disposed on the word line;
    a selection device disposed on the bottom electrode, wherein the selection device comprises a recessed side wall, and wherein a first capping layer is disposed on the recessed side wall of the selection device;
    a middle electrode disposed on the selection device;
    a variable resistance layer disposed on the middle electrode, wherein the variable resistance layer comprises a recessed side wall, and wherein a second capping layer is disposed on the recessed side wall of the variable resistance layer;

a top electrode disposed on the variable resistance layer; and a bit line disposed on the top electrode.

10. The memory device of claim 9, wherein a side wall of the middle electrode is substantially aligned with a side wall of the first capping layer and a side wall of the second capping layer.

11. The memory device of claim 10, further comprising an insulation pattern disposed on the side walls of each of the first capping layer, the middle electrode, and the second capping layer, wherein the insulation pattern is separated from the recessed side wall of the selection device by the first capping layer, and wherein the insulation pattern is separated from the recessed side wall of the variable resistance layer by the second capping layer.

12. The memory device of claim 9, further comprising an insulation liner between the second capping layer and the variable resistance layer.

13. The memory device of claim 9, wherein a width of the selection device is substantially the same as a width of the variable resistance layer.

* * * * *